United States Patent [19]
Ikeda

[11] Patent Number: 6,043,863
[45] Date of Patent: Mar. 28, 2000

[54] HOLDER FOR REFLECTING MEMBER AND EXPOSURE APPARATUS HAVING THE SAME

[75] Inventor: Masatoshi Ikeda, Tokyo, Japan

[73] Assignee: Nikon Corporation, Tokyo, Japan

[21] Appl. No.: 08/968,435

[22] Filed: Nov. 12, 1997

[30] Foreign Application Priority Data

Nov. 14, 1996 [JP] Japan .................................... 8-318656
Mar. 13, 1997 [JP] Japan .................................... 9-076708
Mar. 13, 1997 [JP] Japan .................................... 9-076709

[51] Int. Cl.⁷ ............................ G03B 27/42; G02B 5/08
[52] U.S. Cl. ................................ 355/53; 355/71; 359/849
[58] Field of Search ................................. 355/43–45, 52, 355/53, 67, 71; 359/838, 846, 848, 849, 869, 871; 250/548

[56] References Cited

U.S. PATENT DOCUMENTS

| | | | |
|---|---|---|---|
| 4,364,631 | 12/1982 | Arondel et al. | 359/849 |
| 4,408,874 | 10/1983 | Zinky et al. | 355/52 |
| 4,632,523 | 12/1986 | Knohl | 359/848 |
| 5,035,497 | 7/1991 | Itoh | 359/849 |
| 5,115,351 | 5/1992 | Miyawaki et al. | 359/849 |

FOREIGN PATENT DOCUMENTS

| | | |
|---|---|---|
| 1-238604 | 9/1989 | Japan . |
| 3-296008 | 12/1991 | Japan . |
| 4-133014 | 5/1992 | Japan . |

OTHER PUBLICATIONS

"Opto–Mechanical Systems Design", Paul R. Yoder, Jr., Mounting Large Vertical Axis Mirrors; Published Dekker Optical Engineering; vol. 9, 1996.

*Primary Examiner*—D. Rutledge
*Attorney, Agent, or Firm*—Armstrong, Westerman, Hattori, McLeland and Naughton

[57] ABSTRACT

A holder improving the optical performance of a reflecting optical member in a projection optical system which projects an image of a pattern formed on a mask onto a photosensitive substrate, and an exposure apparatus having the holder. A support mechanism supports a back surface of the reflecting optical member, which is reverse to a reflecting surface thereof, at at least three points. The support points are positioned on a circumference away from the center of the reflecting surface by a distance at least 0.6 times the distance from the center of the reflecting surface to the outer periphery of the reflecting optical member such that the support points are circumferentially spaced along the circumference at equal intervals. Alternatively, a holding member supports the reflecting optical member and forms a closed chamber in combination with the reflecting optical member. The pressure in the closed chamber at the back of the reflecting surface of the reflecting optical member is regulated to a predetermined level. The reflecting optical member is integrally formed with a mounting portion which is secured to the projection optical system.

50 Claims, 18 Drawing Sheets

HOLDER FOR REFLECTING MEMBER AND EXPOSURE APPARATUS HAVING THE SAME

BACKGROUND OF THE INVENTION

The present invention relates to a holder for a reflecting member and also to an exposure apparatus having the holder. More particularly, the present invention relates to a holder which holds a reflecting member of high accuracy such as a reflecting member provided in an optical system that projects a mask pattern onto a photosensitive substrate in a photolithography process to produce, for example, semiconductor devices, image pickup devices (e.g. CCDs), liquid-crystal display devices, or thin-film magnetic heads. The present invention also relates to an exposure apparatus having the holder.

In a photolithography process (i.e. a process for forming a resist image of a mask pattern on a substrate) for producing, for example, semiconductor devices, a projection exposure apparatus (e.g. a stepper) is used in which a pattern of a reticle as a mask is transferred onto a photoresist-coated substrate (or a wafer or the like) through a projection optical system. Examples of projection exposure apparatus used for this purpose include static exposure apparatuses, e.g. step-and-repeat type reduction projection exposure apparatus (so-called stepper), and scanning exposure apparatuses, e.g. step-and-scan or slit-scan exposure apparatus.

In a typical projection exposure apparatus, a pattern written on a reticle is transferred onto a substrate as an image reduced to from ⅕ to ¼ through a projection optical system. Semiconductor devices and so forth are demanded to be as small as possible with a view to reducing the size of equipment incorporating them and also to lowering the power consumption. However, to minimize the size of semiconductor devices and so forth, patterns to be transferred onto substrates must be made finer. In recent years, in particular, the scale of integration of ULSI has further increased, and it has been demanded to form a pattern having a linewidth of 0.35 micron or less, for example, on a substrate.

Conventional projection exposure apparatuses use the g-line (wavelength: 436 nanometers), the i-line (wavelength: 365 nanometers), etc. as exposure light. Recently, however, KrF excimer laser light (wavelength: 248 nanometers), ArF excimer laser light (wavelength: 193 nanometers), etc. have come into use in order to form a pattern with a narrow linewidth as stated above on a substrate. Incidentally, when an exposure process is carried out by using exposure light in such a wavelength band, a catadioptric system using a reflecting mirror is frequently employed as a projection optical system because it has the advantage that a satisfactory demagnification ratio can be obtained and the optical system per se can be made compact.

However, to transfer a pattern with a narrow linewidth as stated above onto a substrate, it is necessary not only to change the type of exposure light but also to improve the catadioptric system in the accuracy concerning the configuration, for example, and to bring its optical characteristics close to the ideal values. In general, such a catadioptric system is formed from a plurality of optical elements. Accordingly, it is necessary in order to improve the overall accuracy of the catadioptric system to improve the accuracy of each individual optical element. A concave mirror or a plane mirror as a reflecting optical member that constitutes a part of the catadioptric system exhibits extremely high accuracy in the state of being a single element. However, when the degree of accuracy required for the optical system becomes extremely high, some problems arise. That is, the reflecting surface is deformed on account of the way in which it is supported, and this causes the optical performance to be degraded. This problem will be explained below.

A concave mirror is produced by forming a concave surface of a predetermined configuration on a glass material, a ceramic material, or Zerodur (registered trademark) and evaporating aluminum coating or the like on the concave surface. Glass and other similar material are hard by nature. Therefore, in ordinary optical equipment, even if the reflecting mirror is deformed owing to the way in which it is supported, it is possible to ignore degradation of optical characteristics caused by the deformation of the reflecting mirror.

However, in the recent projection exposure apparatuses, a catadioptric system of extremely high accuracy is needed as stated above; therefore, only a slight deflection of the reflecting mirror due to its own weight may cause a problem. Accordingly, even when the concave surface is machined with high accuracy, if the way of supporting the reflecting mirror as incorporated in optical equipment differs from that during the machining process, the concave surface may be deformed, resulting in a concave mirror incapable of exhibiting the desired optical characteristics when used. Accordingly, to produce a concave mirror of high accuracy, such a technique is often adopted that a concave surface is formed on a stock in a state where the surface being machined is allowed to deflect by its own weight by supporting the stock in a position in which the resulting concave mirror will be actually supported, and then carrying out vapor deposition.

The concave mirror produced by the above-described technique exhibits the highest optical performance when the way of supporting the concave mirror during machining is the same as the way of supporting the concave mirror as incorporated in optical equipment. However, it is difficult to make the mirror supporting modes on the two occasions completely agree with each-other. Accordingly, the way of supporting the concave mirror during machining and the way of supporting the concave mirror as incorporated in optical equipment are made as similar to each other as possible, thereby making deformations on the two occasions similar to each other and thus obtaining the desired optical performance. The similarly in deformation of the concave surface between the concave mirror during machining and the concave mirror as incorporated in optical equipment will hereinafter be referred to as "reproducibility of deflection".

FIGS. 17(*a*) and 17(*b*) are diagrams showing a concave mirror as supported by a support frame according to a prior art. FIG. 17(*a*) is a top plan view of the concave mirror supported by the support frame. FIG. 17(*b*) shows the concave mirror and the support frame in a sectional view taken along the line XVIIB—XVIIB in FIG. 17(*a*). It should be noted that the concave surface of the concave mirror Ml is machined in a state where the concave mirror Ml is supported by a support frame having the same configuration as that of the support frame 540 in an exposure apparatus.

As shown in FIGS. 17(*a*) and 17(*b*), a cylindrical support frame 540 has a small inner-diameter portion 540*a* and a large inner-diameter portion 540*b*, which are in a coaxial relation to each other. The large inner-diameter portion 540*b* has a peripheral groove 540*c* formed on the upper end thereof. The outer diameter of the concave mirror Ml is larger than the inner diameter of the small inner-diameter portion 540a and equal to the inner diameter of the large inner-diameter portion 540b. Accordingly, when the concave mirror M1 is inserted into the large inner-diameter portion 540b of the support frame 540, the outer peripheral portion at the back of the concave mirror M1 is supported by the upper surface of the small inner-diameter portion 540a. It should be noted that the concave mirror M1 is secured to the support frame 540 by a silicone adhesive filled in the peripheral groove 540c.

The outer peripheral portion at the back of the concave mirror M1 contacts the upper surface of the small inner-diameter portion 540a at the entire circumference thereof in theory, but the concave mirror M1 is partially supported by the support frame 540 at two or three points in practice because the respective contact surfaces of the concave mirror M1 and the support frame 540 cannot be finished with perfect flatness and parallelism.

Under such circumstances, it is impossible in designing to predict at which points the outer peripheral portion at the back of the concave mirror M1 will be supported. Therefore, the reproducibility of deflection cannot be obtained. In other words, no matter how accurately the concave surface is machined when the concave mirror M1 is in the state of being a single element, when the concave mirror M1 is supported by the support frame 540, the concave surface may be deformed in various ways according to points at which it is supported. Therefore, it may be impossible to obtain the desired optical characteristics. It should be noted that if the concave mirror M1 is secured to the support frame 540 by using bolts or the like, the degree of adhesion between the two members increases. However, the fastening force applied through the bolts may cause the concave surface to be distorted even more unfavorably.

FIGS. 18(a) and 18(b) are diagrams showing a concave mirror as supported by a support frame according to another prior art which has a configuration different from that of the support frame shown in FIGS. 17(a) and 17(b). FIG. 18(a) is a top plan view of the concave mirror supported by the support frame. FIG. 18(b) shows the concave mirror and the support frame in a sectional view taken along the line XVIIIB—XVIIIB in FIG. 18(a). It should be noted that the concave surface of the concave mirror M1 is machined in a state where the concave mirror M1 is supported by a support frame having the same configuration as that of the support frame 640 in an exposure apparatus.

The prior art shown in FIGS. 18(a) and 18(b) differs from the prior art shown in FIGS. 17(a) and 17(b) in that the cylindrical support frame 640 has a uniform inner diameter over the entire length thereof and further has three projections 640a inwardly projecting from a central portion of the support frame 640 at equal angular intervals. The projections 640a support the outer peripheral portion at the back of the concave mirror M1.

According to the prior art shown in FIG. 18(a) and 18(b), the outer peripheral portion at the back of the concave mirror M1 is supported at three points set at approximately equal intervals. Consequently, the supporting structure provides an improvement in the reproducibility of deflection of the concave surface over such a supporting structure that the concave mirror M1 is supported by the support frame 540 shown in FIGS. 17(a) and 17(b). However, even within the narrow upper surface of each projection 640a, there may be undesired partial contact between the projection 640a and the back surface of the concave mirror M1. Such partial contact causes the reproducibility of deflection to be degraded and thus makes it difficult to form a concave mirror of high accuracy.

Supporting the concave mirror M1 by three-point seats means that the concave mirror M1 is not supported by any other than the three-point seats. Accordingly, the peripheral portion of the concave mirror M1 is deflected in a trefoil shape (i.e. non-supported portions lower) by the weight of the concave mirror M1 (by the action of gravity G). Consequently, the concave mirror M1 is distorted asymmetrically with respect to the optical axis. In this case also, the optical performance is deteriorated.

A plane mirror is also generally produced by evaporating aluminum coating or the like on one surface of a flat glass, ceramic or Zerodur (registered trademark) plate. Incidentally, because glass and other similar materials are hard by nature, deformation of the plane mirror caused by supporting it is only slight. Therefore, in ordinary optical equipment, it is possible to ignore degradation of optical characteristics caused by the deformation of the plane mirror no matter how it is supported.

However, in the recent projection exposure apparatuses, a catadioptric system of extremely high accuracy is needed as stated above. Therefore, the overall optical characteristics of the catadioptric system may be degraded by distortion of the plane mirror that occurs depending upon the way of supporting the plane mirror. The similarly in deformation between the plane mirror during machining and the plane mirror as incorporated in optical equipment will hereinafter be referred to as "reproducibility of deflection".

FIGS. 19(a) and 19(b) are diagrams showing a plane mirror as supported by a support frame according to a prior art. FIG. 19(a) is a top plan view of the plane mirror supported by the support frame. FIG. 19(b) shows the plane mirror and the support frame in a sectional view taken along the line XIXB—XIXB in FIG. 19(a).

In FIGS. 19(a) and 19(b), a prism-shaped support frame 710 whose section perpendicular to the longitudinal direction has an isosceles triangle-shaped configuration has a horizontal surface 710a, a vertical surface 710b perpendicular to the horizontal surface 710a, and a slant surface 710c extending at an angle to each of the horizontal and vertical surfaces 710a and 710b. The support frame 710 is provided with an opening 710d extending from the horizontal surface 710a to the slant surface 710c and also provided with an opening 710e extending from the vertical surface 710b to the slant surface 710c. The openings 710d and 710e have a mutual opening end 710f at the slant surface 710c.

A plate-shaped plane mirror M52 has a flat mirror surface M52a placed in contact with the slant surface 710c so as to face the opening end 710f. A back surface M52b reverse to the mirror surface M52a is supported by four leaf springs 711. Each leaf spring 711 is secured to the support frame 710 by using a bolt 712. Accordingly, the plane mirror M52 is pressed toward the support frame 710 by resilient forces from the leaf springs 711.

Thus, the plane mirror M52 is pressed toward the slant surface 710c, and hence the degree of adhesion between them increases. However, because the slant surface 710c is provided with the opening end 710f, counterforce that the plane mirror M52 receives from the slant surface 710c is not uniform over the whole surface of the plane mirror M52. Therefore, even if the mirror surface M52a has a high degree of flatness when the plane mirror M52 is a single element, the flatness may be degraded by placing the plane mirror M52 in close contact with the support frame 710. The degradation of the flatness of the mirror surface M52a causes a reduction in optical characteristics, e.g. image-formation characteristics, of a catadioptric system using the plane mirror M52.

SUMMARY OF THE INVENTION

A first object of the present invention is to provide a holder which supports a reflecting optical member in such a way that optical characteristics of the reflecting surface are optimized.

A second object of the present invention is to provide an exposure apparatus having a holder which supports a reflecting optical member in such a way that optical characteristics of the reflecting surface are optimized.

To attain the first object, according to a first aspect of the present invention, there is provided a holder which holds a reflecting optical member. The holder has a support mechanism which supports a back surface of the reflecting optical member, which is reverse to a reflecting surface of the reflecting optical member, at least three support points. The support points of the support mechanism are positioned on a circumference away from the center of the reflecting surface by a distance at least 0.6 times the distance from the center of the reflecting surface to the outer periphery of the reflecting optical member such that the support points are circumferentially spaced along the circumference at equal intervals.

It is preferable that the support mechanism should have a support plate and support members which support the reflecting optical member with respect to the support plate, and that each of the support members should be non-fixed at least one of ends thereof which face the support plate and the reflecting optical member, respectively.

By virtue of the arrangement of the holder according to the first aspect of the present invention, the support mechanism has support points lying on a circumference away from the center of the reflecting surface of the reflecting optical member by a distance at least 0.6 times the distance from the center of the reflecting surface to the outer periphery of the reflecting optical member. Therefore, the deflection of the reflecting optical member can be geometrically minimized. This makes it possible to minimize the amount by which the reflecting optical member is correctively polished during machining process, for example. Because the support points are circumferentially spaced along the circumference at equal intervals, the reflecting optical member is induced to deflect in point symmetry with respect to the optical axis. Thus, it is possible to reduce asymmetric components of deflection and to improve uniformity.

To attain the second object, according to a second aspect of the present invention, there is provided a holder which supports a reflecting optical member. The holder includes a support plate which supports the reflecting optical member; support members which support a back surface of the reflecting optical member at at least three support points; pressing mechanisms which press the back surface of the reflecting optical member at respective pressing points different from the support points; and an adjusting mechanism provided for each of the pressing mechanisms to adjust pressing force with which the associated pressing mechanism presses the back surface of the reflecting optical member.

It is preferable that the support points and the pressing points should lie on the same circumference a predetermined distance away from the center of the reflecting optical member, and that the support points should be circumferentially spaced along the circumference at equal intervals.

The arrangement may be such that the pressing mechanism includes a fulcrum provided on the support plate, a transmission arm pivotably mounted on the fulcrum, and a pressing member provided on one end of the transmission arm to press the back surface of the reflecting optical member at the pressing point, and that the pressing member includes a rod member standing on the one end of the transmission arm, and further that the adjusting member includes a weight member mounted on the other end of the transmission arm.

The pressing member may include a pair of magnets magnetized with magnetic poles of the same sign, which are respectively disposed on the transmission arm and the back surface of the reflecting optical member at the pressing point so as to face opposite to each other.

In the holder according to the second aspect of the present invention, the back surface of the reflecting optical member is, for example, fixedly supported by a three-point supporting structure, which enables physically the most stable support, and non-fixedly supported at other support points. Accordingly, the reflecting optical member can be stably supported. The pressing force at each of the non-fixed support points can be adjusted by an adjusting mechanism to the same level as that of bearing force at each of the fixed support points. Consequently, the amount of deflection of the reflecting optical member at each support point can be made equal to each other, and thus the deflection of the reflecting optical member can be minimized even more effectively.

To attain the above-described first object, according to a third aspect of the present invention, there is provided a holder which holds a reflecting optical member. The holder has a holding member which supports the reflecting optical member and forms a closed chamber in combination with the reflecting optical member. The pressure in the closed chamber at the back of a reflecting surface of the reflecting optical member is regulated to a predetermined level.

By virtue of the arrangement of the holder according to the third aspect of the present invention, the deflection of the reflecting optical member due to its own weight is canceled by the pressure in the closed chamber. Therefore, favorable optical performance can be obtained.

The pressure in the closed chamber may be maintained at a constant level. However, it is preferable for the holder to have a pressure regulating device which regulates the pressure in the closed chamber to a predetermined level. If such a pressure regulating device is provided, even when the difference between the gas pressure in the closed chamber and the gas pressure outside it has changed with variations in the environmental conditions, e.g. the outside-gas pressure, the pressure in the closed chamber is controlled by the pressure regulating device to regulate the inside- and outside-gas pressure difference, thereby enabling deformation of the reflecting optical member to be minimized or prevented. If the inside- and outside-gas pressure difference, which is a difference between the gas pressure in the closed chamber and the gas pressure outside it, is set so as to cancel the gravity acting on the reflecting optical member, it is possible to cancel the influence of the gravity acting on the reflecting optical member by controlling the pressure in the closed chamber. Thus, deformation of the reflecting optical member due to its own weight is prevented, and favorable optical performance can be obtained.

The reflecting optical member may be supported by three-point seats provided on a side wall portion constituting the closed chamber. By doing so, the influence of the deflection of the mirror surface can be reduced as in the case of the above-described prior art in which the reflecting mirror is supported by three-point seats. Moreover, because the pressure in the closed chamber is applied to the reflecting optical member from the back thereof, deformation (e.g. trefoil deflection) of the reflecting optical member due to its own weight is prevented, and favorable optical performance can be obtained.

The reflecting optical member may be clamped by the three-point seats in combination with pressing plates which press the peripheral edge portion of the reflecting optical member at respective positions of the three-point seats. By doing so, the reflecting optical member can be prevented from being undesirably lifted even when the pressure in the closed chamber is applied to the reflecting optical member from the back thereof to cancel the deflection of the reflecting optical member due to its own weight.

The reflecting surface of the reflecting optical member and the back surface of the reflecting optical member, which is reverse to the reflecting surface, do not necessarily need to have the same surface configuration. However, the back surface of the reflecting optical member may have the same surface configuration as that of the reflecting surface so that the thickness of the reflecting optical member between the reflecting surface and the back surface is uniform. With this arrangement, the gravity acting on the reflecting optical member is made uniform in the case of a plane mirror, for example. Consequently, the influence of the gravity can be readily canceled by the pressure in the closed chamber, which is uniformly applied to the reflecting optical member from the back thereof.

In place of the arrangement in which the back surface of the reflecting optical member is given the same surface configuration as that of the reflecting surface so that the thickness of the reflecting optical member between the reflecting surface and the back surface is uniform, the distribution of thickness in the gravitational direction of the reflecting optical member may be varied from the central portion of the reflecting optical member to the peripheral portion thereof so that the reflecting optical member is not deflected in the gravitational direction. For example, in a case where the surface configuration of the back of the reflecting mirror is curved at the peripheral portion thereof, the relationship between the gravity and the pressure in the closed chamber that is applied to the back of the reflecting mirror is different between the central and peripheral portions of the reflecting mirror, and this may cause the reflecting mirror to be deflected. However, it is possible to prevent deflection of the reflecting mirror by varying the thickness of the reflecting mirror according to the relationship between the gravity and the pressure in the closed chamber.

There are various pressure regulating devices usable to control the pressure in the closed chamber. For example, the pressure in the closed chamber may be controlled by causing a piston or the like to enter or withdraw from the closed chamber. It is also possible to use a pump as a pressure regulating device for the closed chamber such that the pump regulates the pressure in the closed chamber to a predetermined level by causing a fluid to flow into or out of the closed chamber. By doing so, it is possible to readily change fluids used to control the pressure in the closed chamber, for example, the types of gas, e.g. air and nitrogen. It also becomes easy to control the pressure in the closed chamber by using a fluid other than gases, e.g. a liquid. Moreover, it is possible to widen the controllable pressure range in comparison to the pressure control using a piston or the like.

In this case, only the pressure applied to the back of the reflecting mirror may be controlled by causing a fluid to flow into and out of the closed chamber, but it is also possible to perform both the pressure control and cooling by using cooling water which cools the reflecting mirror as a fluid for the pressure control. By doing so, the temperature of the reflecting mirror can be prevented from being raised by light (e.g. ArF excimer laser) reflected by the reflecting mirror. Accordingly, it is possible to prevent deterioration of the optical performance due to thermal expansion of the reflecting mirror.

The holder may further include an inside-gas pressure measuring device which measures an inside-gas pressure in the closed chamber; an outside-gas pressure measuring device which measures an outside-gas pressure outside the closed chamber; and a controller which controls the pressure regulating device such that the inside-gas pressure in the closed chamber is regulated on the basis of a difference between the inside-gas pressure measured by the inside-gas pressure measuring device and the outside-gas pressure measured by the outside-gas pressure measuring device.

According to the above-described arrangement, the gas pressure in the closed chamber is measured by the inside-gas pressure measuring device, and the gas pressure outside the closed chamber is measured by the outside-gas pressure measuring device. The controller controls the pressure regulating device such that the gas pressure in the closed chamber is regulated on the basis of a difference between the inside-gas pressure measured by the inside-gas pressure measuring device and the outside-gas pressure measured by the outside-gas pressure measuring device. Accordingly, even when there is a change in the outside-gas pressure, it is possible to regulate the gas pressure in the closed chamber to a pressure needed to cancel the deflection of the reflecting mirror due to its own weight. Thus, favorable optical performance can be obtained.

To attain the above-described second object, according to a fourth aspect of the present invention, there is provided an exposure apparatus which transfers an image of a pattern formed on a mask onto a photosensitive substrate. The apparatus has a projection optical system including a reflecting optical member and arranged to project the image of the pattern onto the photosensitive substrate, and a holder which holds the reflecting optical member. The holder has a support mechanism which supports a back surface of the reflecting optical member, which is reverse to a reflecting surface thereof, at at least three support points. The support points of the support mechanism are positioned on a circumference away from the center of the reflecting surface by a distance at least 0.6 times the distance from the center of the reflecting surface to the outer periphery of the reflecting optical member such that the support points are circumferentially spaced along the circumference at equal intervals.

Thus, in the exposure apparatus according to the fourth aspect of the present invention, the support points of the support mechanism are positioned on a circumference away from the center of the reflecting surface by a distance at least 0.6 times the distance from the center of the reflecting surface to the outer periphery of the reflecting optical member. Therefore, the deflection of the reflecting optical member can be geometrically minimized. This makes it possible to minimize the amount by which the reflecting optical member is correctively polished during machining process, for example. Because the support points are circumferentially spaced along the circumference at equal intervals, the reflecting optical member is induced to deflect in point symmetry with respect to the optical axis. Accordingly, it is possible to reduce asymmetric components of deflection and to improve uniformity. Thus, it is possible to provide an exposure apparatus having favorable optical performance.

To attain the above-described second object, according to a fifth aspect of the present invention, there is provided an exposure apparatus which transfers an image of a pattern formed on a mask onto a photosensitive substrate. The apparatus has a projection optical system including a reflecting optical member and arranged to project the image of the pattern onto the photosensitive substrate, and a holder having a support plate which supports the reflecting optical member. The holder has support members which support a back surface of the reflecting optical member at at least three support points; pressing mechanisms which press the back surface of the reflecting optical member at respective pressing points different from the support points; and an adjusting mechanism provided for each of the pressing mechanisms to adjust pressing force with which the associated pressing mechanism presses the back surface of the reflecting optical member.

Thus, in the exposure apparatus according to the fifth aspect of the present invention, the back surface of the reflecting optical member is, for example, fixedly supported by a three-point supporting structure, which enables physically the most stable support, and non-fixedly supported at other support points. Accordingly, the reflecting optical member can be stably supported. The pressing force at each of the non-fixed support points can be adjusted by an adjusting mechanism to the same level as that of bearing force at each of the fixed support points. Consequently, the amount of deflection of the reflecting optical member at each support point can be made equal to each other. As a result, the deflection of the reflecting optical member can be minimized even more effectively. Thus, it is possible to provide an exposure apparatus having favorable optical performance.

To attain the above-described second object, according to a sixth aspect of the present invention, there is provided an exposure apparatus which transfers an image of a pattern formed on a mask onto a photosensitive substrate. The apparatus has a projection optical system including a reflecting optical member and arranged to project the image of the pattern onto the photosensitive substrate, and a holder which supports the reflecting optical member. The holder has a holding member which supports the reflecting optical member and forms a closed chamber in combination with the reflecting optical member. The pressure in the closed chamber at the back of a reflecting surface of the reflecting optical member is regulated to a predetermined level.

To attain the above-described second object, according to a seventh aspect of the present invention, there is provided an exposure apparatus which transfers an image of a pattern formed on a mask onto a photosensitive substrate through a projection optical system. The projection optical system is formed from a catadioptric system including one or a plurality of reflecting mirrors as reflecting optical members. The apparatus has a holding member which supports at least one of the reflecting mirrors and forms a closed chamber in combination with the reflecting mirror. The pressure in the closed chamber at the back of a reflecting surface of the reflecting mirror is regulated by a pressure control system on the basis of the weight of the reflecting mirror and a difference between the pressure in the closed chamber and the pressure outside the closed chamber.

Thus, in the exposure apparatus according to the seventh aspect of the present invention, the projection optical system which transfers an image of a pattern formed on a mask onto a photosensitive substrate is formed from a catadioptric system including one or a plurality of reflecting mirrors as reflecting optical members. The apparatus has a holding member which supports at least one of the reflecting mirrors and forms a closed chamber in combination with the reflecting mirror. The pressure in the closed chamber is regulated by a pressure control system on the basis of the weight of the reflecting mirror and a difference between the pressure in the closed chamber and the pressure outside the closed chamber. In the exposure apparatus, therefore, the gravity component acting on the reflecting mirror, which constitutes the projection optical system, is canceled by regulating the pressure in the closed chamber, thereby preventing the reflecting mirror from being deflected by its own weight. Thus, it is possible to prevent deterioration of the optical performance. Accordingly, an exposure process of high accuracy can be realized.

The arrangement may be such that the catadioptric system is an optical system which includes one or a plurality of reflecting mirrors as reflecting optical members and in which a plurality of reflections take place, and that a first reflecting optical member constituting the catadioptric system is the reflecting mirror having the closed chamber subjected to pressure control by the pressure control system.

According to the above-described arrangement, the catadioptric system is formed from an optical system in which a plurality of reflections take place, and the first reflecting member in the catadioptric system is a reflecting mirror having the closed chamber subjected to pressure control by the pressure control system. Thus, at least the first reflecting member in the exposure apparatus is formed by using a reflecting mirror of high accuracy, deflection of which due to its own weight can be canceled by controlling the pressure in the closed chamber. Therefore, it is possible to realize an exposure process of high accuracy.

To attain the above-described second object, according to an eighth aspect of the present invention, there is provided an exposure apparatus which transfers an image of a pattern formed on a mask onto a photosensitive substrate. The apparatus has a projection optical system including a reflecting optical member and arranged to project the image of the pattern onto the photosensitive substrate. The reflecting optical member is integrally formed with a mounting portion which is secured to the projection optical system.

Thus, in the exposure apparatus according to the eighth aspect of the present invention, a mounting portion is integrally formed on the reflecting optical member. Therefore, the reflecting optical member can be satisfactorily supported without providing, for example, a leaf spring, which may deform the reflecting optical member by applying bearing force to it. Consequently, it is possible to minimize the deformation of the reflecting optical member.

BRIEF DESCRIPTION OF THE DRAWINGS

FIGS. 3(a) and 3(b) are diagrams showing a concave mirror in FIG. 2 as supported by a holder according to a first embodiment of the present invention, in which FIG. 3(a) is a top plan view, and FIG. 3(b) is a sectional view taken along the line IIIB—IIIB in FIG. 3(a).

FIGS. 5(a) and 5(b) are diagrams showing the concave mirror in FIG. 2 as supported by a holder according to a second embodiment of the present invention, in which FIG. 5(a) is a top plan view, and FIG. 5(b) is a sectional view taken along the line VB—VB in FIG. 5(a).

FIGS. 6(a) and 6(b) are diagrams showing the concave mirror in FIG. 2 as supported by a holder according to a third embodiment of the present invention, in which FIG. 6(a) is a top plan view, and FIG. 6(b) is a sectional view taken along the line VIB—VIB in FIG. 6(a).

FIGS. 7(a), 7(b) and 7(c) are diagrams showing a support member mounted on a lower flange portion of the holder according to the third embodiment, in which FIG. 7(a) is a front view; FIG. 7(b) is a sectional view taken along the line VIIB—VIIB in FIG. 7(a); and FIG. 7(c) shows the support member as seen from the direction of the arrow VIIC in FIG. 7(b).

FIGS. 8(a) and 8(b) are diagrams showing the concave mirror in FIG. 2 as supported by a holder according to a fourth embodiment of the present invention, in which FIG. 8(a) is a top plan view, and FIG. 8(b) is a sectional view taken along the line VIIIB—VIIIB in FIG. 8(a).

FIGS. 9(a) and 9(b) are diagrams showing the concave mirror in FIG. 2 as supported by a holder according to a fifth embodiment of the present invention, in which FIG. 9(a) is a top plan view, and FIG. 9(b) is a sectional view taken along the line IXB—IXB in FIG. 9(a).

FIGS. 11(a) and 11(b) are diagrams showing a concave mirror in FIG. 10 as supported by a holder according to a sixth embodiment of the present invention, in which FIG. 11(a) is a top plan view, and FIG. 11(b) is a sectional view taken along the line XIB—XIB in FIG. 11(a).

FIGS. 15(a) and 15(b) are diagrams showing a plane mirror in FIG. 2 as supported by a support frame according to another embodiment of the present invention, in which FIG. 15(a) is a top plan view, and FIG. 15(b) is a sectional view taken along the line XVB—XVB in FIG. 15(a).

FIGS. 16(a) and 16(b) are diagrams showing a plane mirror in FIG. 2 as supported by the support frame according to another embodiment of the present invention, in which FIG. 16(a) is a top plan view, and FIG. 16(b) is a sectional view taken along the line XVIB—XVIB in FIG. 16(a).

FIGS. 17(a) and 17(b) are diagrams showing a concave mirror as supported by a support frame according to a prior art, in which FIG. 17(a) is a top plan view, and FIG. 17(b) is a sectional view taken along the line XVIIB—XVIIB in FIG. 17(a).

FIGS. 18(a) and 18(b) are diagrams showing a concave mirror as supported by a support frame according to another prior art, in which FIG. 18(a) is a top plan view, and FIG. 18(b) is a sectional view taken along the line XVIIIB—XVIIIB in FIG. 18(a).

FIGS. 19(a) and 19(b) are diagrams showing a plane mirror as supported by a support frame according to a prior art, in which FIG. 19(a) is a top plan view, and FIG. 19(b) is a sectional view taken along the line XIXB—XIXB in FIG. 19(a).

DESCRIPTION OF THE PREFERRED EMBODIMENTS

Embodiments of the present invention will be described below. In the embodiments, the present invention is applied to a projection optical system of a step-and-scan projection exposure apparatus, i.e. a scanning exposure type projection exposure apparatus.

First, a projection exposure apparatus to which a holder for a reflecting optical member according to the present invention is applied will be described with reference to FIGS. 1 to 9.

Figure 1:
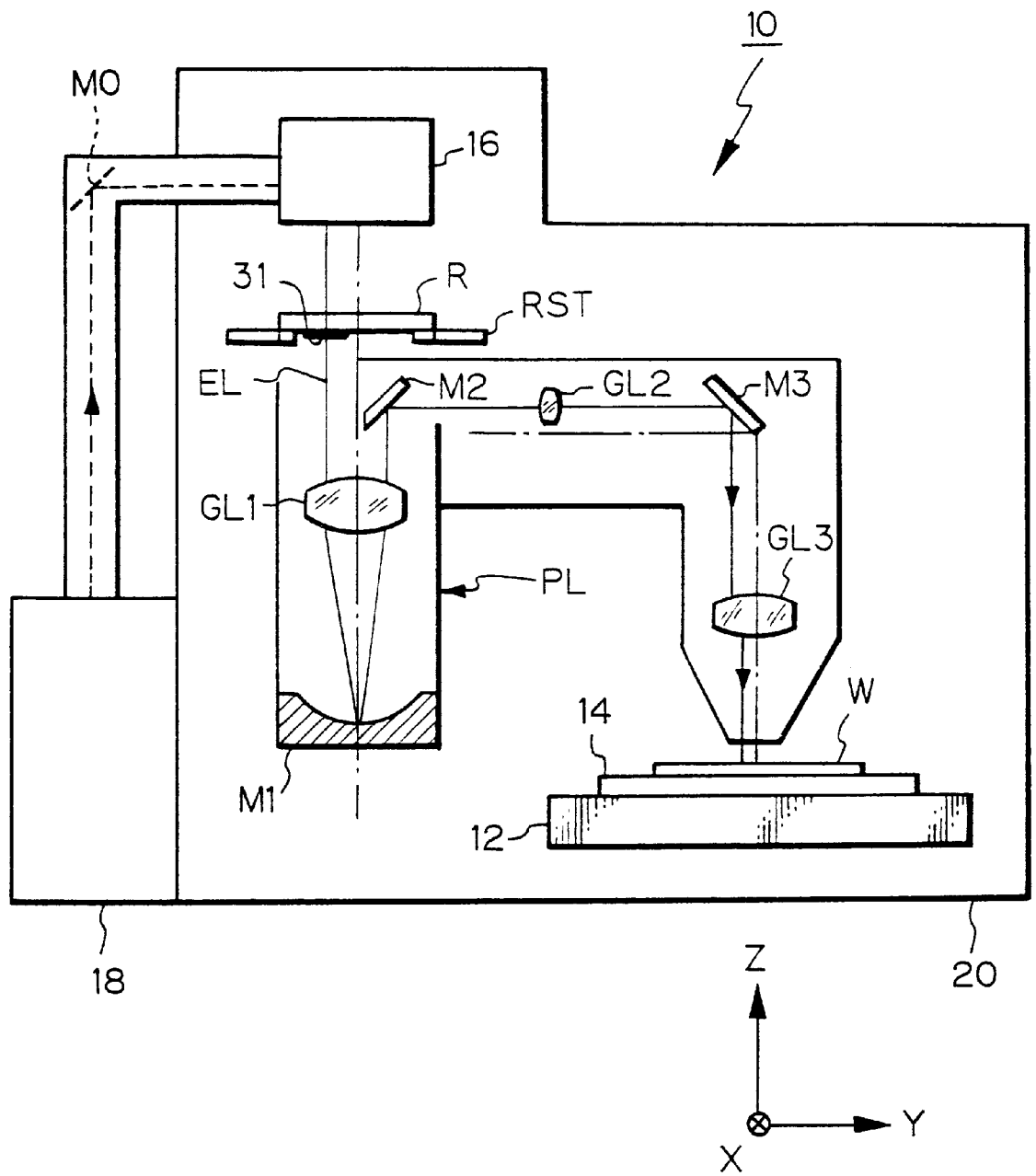
FIG. 1 is a diagram schematically showing a projection exposure apparatus equipped with a holder for a reflecting optical member according to the present invention.

FIG. 1 shows schematically the arrangement of a projection exposure apparatus 10 to which a holder for a reflecting optical member according to the present invention is applied.

The projection exposure apparatus 10 has a Y stage 12 movable in a Y-axis direction (a lateral direction in the plane of FIG. 1) in a horizontal plane; an X stage 14 movable in an X-axis direction (a direction perpendicular to the plane of FIG. 1) perpendicular to the Y-axis over the Y stage 12; a projection optical system PL telecentric on both sides and comprising a catadioptric system (hereinafter referred to as "-type optical system") disposed above the X stage 14; a reticle stage RST disposed above the projection optical system PL and movable in the Y-axis direction with a reticle R as a mask held thereon; an illumination optical system 16 disposed above the reticle stage RST; and an exposure light source 18. All the constituent elements, exclusive of the exposure light source 18, are accommodated in a chamber 20 in which temperature, humidity, etc. are maintained with high accuracy.

In this embodiment, an ArF excimer laser, which emits laser light of wavelength 193 nanometers, is used as the exposure light source 18. In general, to expose a fine circuit pattern (e.g. a pattern with a linewidth of the order of submicrons), it is conceivable to shorten the wavelength of exposure light or to increase the numerical aperture (N.A.) of the projection optical system. However, if the numerical aperture is increased, the depth of focus becomes shallower. Therefore, it is inadvisable to make the numerical aperture larger than necessary. Accordingly, ArF excimer laser light, which has a short wavelength, is employed as a practical technique of exposing a fine circuit pattern. Laser light from the exposure light source 18 enters the illumination optical system 16 via a mirror MO.

In the figure, the continuous line representing the optical path of exposure light EL shows a principal ray of the exposure light EL.

The illumination optical system 16 includes various lens systems, i.e. a relay lens, a fly's-eye lens and a condenser lens, an aperture stop, and a blind disposed at a position conjugate with the pattern surface of the reticle R (none of the constituent elements of the illumination optical system 16 are shown in the figure).

The reticle stage RST is finely movable in the X-axis direction and also finely rotatable about the Z-axis. Moreover, the reticle stage RST is driven to move in the Y-axis direction by a driving system (not shown). During scanning exposure, the reticle stage RST is synchronously moved in a direction opposite to the direction of movement of the Y stage 12 with a speed ratio determined according to the demagnification ratio of the projection optical system PL under the control of a controller (not shown).

The projection optical system PL used in this embodiment comprises a catadioptric system having three reflecting optical members to perform three reflections and has a predetermined demagnification ratio 1/n (n is a positive integer). Therefore, even when ArF excimer laser light is used as exposure light, it is possible to expose a fine circuit pattern at satisfactorily high resolution without substantially increasing the size of the projection optical system PL. The arrangement of the projection optical system PL will be described later.

The X stage 14 has a wafer W as a photosensitive substrate placed thereover through a wafer holder (not shown). The surface of the wafer W is coated with a chemically amplified resist, which is a highly sensitive resist, as a photosensitive material. The positions of the X stage 14 and the Y stage 12 are measured by an interferometer system (not shown). The measured values by the interferometer system are monitored by the abovementioned controller.

According to the projection exposure apparatus 10 arranged as described above, when exposure light is emitted from the exposure light source 18 in a state where the wafer W and the reticle R have been aligned with each other, the exposure light passes through the illumination optical system 16. At this time, the sectional configuration of the exposure light is limited by the blind in the illumination optical system 16. Then, the limited exposure light passes through the relay lens, the condenser lens, etc. to illuminate a slit-shaped illumination area 31 on the reticle R with a uniform illuminance, which has a circuit pattern written thereon. Next, exposure light passing through the reticle R enters the projection optical system PL, whereby the circuit pattern on the reticle R is projected onto the wafer W as a 1/n demagnified image. During the exposure, the reticle R and the wafer W are synchronously scanned with a predetermined speed ratio in respective directions opposite to each other along the Y-axis. Thus, the whole pattern on the reticle R is transferred onto one shot area on the wafer W. The scanning exposure is carried out for each shot area on the wafer W in a step-by-step manner. As a result, the pattern on the reticle R is transferred onto all the shot areas on the wafer W.

Figure 2:
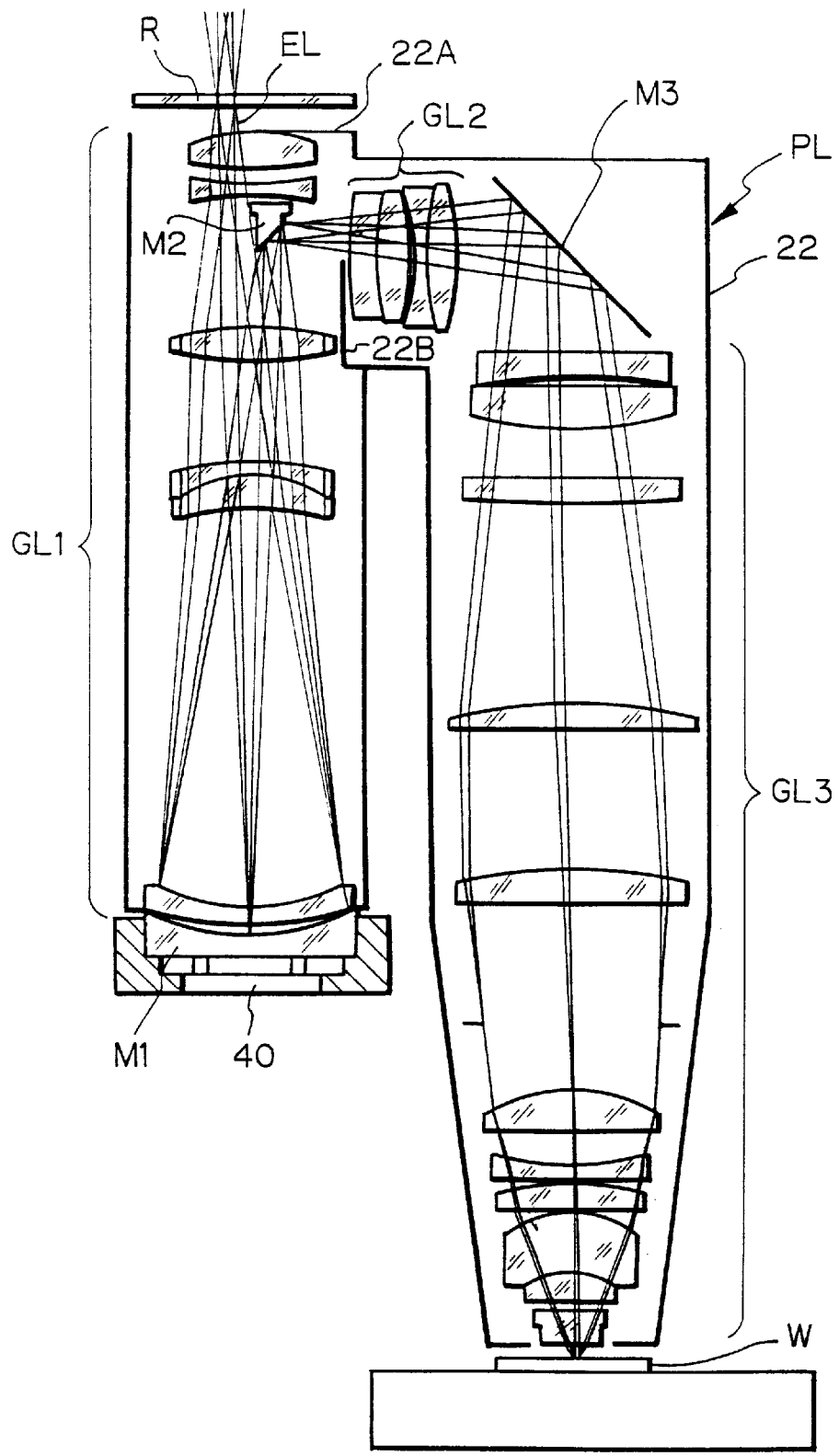
FIG. 2 is an enlarged view of a projection optical system in the projection exposure apparatus shown in FIG. 1.

FIG. 2 is an enlarged view of the projection optical system PL shown in FIG. 1. As shown in FIG. 2, the projection optical system PL has a lens barrel 22 having an approximately shape as viewed from the front. The lens barrel 22 has an opening in a reticle-facing end portion thereof and another opening in a wafer-facing end portion thereof. The projection optical system PL further has three lens units GL1 to GL3 and three reflecting optical members (concave and plane mirrors) M1 to M3, which constitute a reduction optical system as a whole. More specifically, the first lens unit GL1 comprises a plurality of concave and convex lenses disposed below the reticle R along the Z-axis direction (i.e. the vertical direction as viewed in the figure) and having a common optical axis extending in the Z-axis direction. The third lens unit GL3 comprises a plurality of concave and convex lenses disposed above the wafer W along the Z-axis direction and having a common optical axis extending in the Z-axis direction.

A concave mirror M1 is disposed directly below the first lens unit GL1. The concave mirror M1 is held by a holder 40 according to the present invention. A prism mirror M2 is disposed at the position of a pupil plane of the projection optical system PL above the first lens unit GL1. A relatively large plane mirror M3 is disposed above the third lens unit GL3. The second lens unit GL2 is disposed between the two mirrors M2 and M3. The second lens unit GL2 comprises a plurality of lenses having a common optical axis extending in a direction perpendicular to the Z-axis. In this embodiment, the plane mirror M3 is not a half-mirror but an ordinary reflecting mirror by which nearly all the exposure light is reflected.

In the projection optical system PL according to this embodiment, the reticle-facing end portion of the lens barrel 22 extends as far as the vicinity of the optical axis of the first lens unit GL1. The extending end portion forms a first light-blocking plate 22A that prevents entry of light from above into the right-hand half of the first lens unit GL1 as shown in FIG. 2. Similarly, a boundary portion of the lens barrel 22 between the first lens unit GL1 and the second lens unit GL2 extends as far as the vicinity of the optical axis of the second lens unit GL2, and this portion forms a second light-blocking plate 22B that prevents unnecessary reflected light and irregularly reflected light from the first lens unit GL1 from entering the second lens unit GL2.

According to the projection optical system PL, as shown in FIG. 2, exposure light EL passing through the reticle R enters the projection optical system PL and passes through the left-hand half of the first lens unit GL1 to reach the concave mirror M1. The incident light is reflected by the concave mirror M1 in a direction symmetrical with the incident direction with respect to the optical axis AX. The reflected light passes through the right-hand half of the first lens unit GL1 to reach the prism mirror M2. Then, the exposure light EL is reflected by the prism mirror M2 to change the direction of travel to a direction parallel to the optical axis of the second lens unit GL2, and passes through the upper half of the second lens unit GL2 to reach the plane mirror M3. The exposure light EL is reflected by the plane mirror M3 to change the direction of travel to a direction parallel to the optical axis of the third lens unit GL3, and passes through the left-hand half of the third lens unit GL3 to reach the surface of the wafer W.

The projection exposure apparatus 10 according to this embodiment is arranged as stated above. The concave mirror M1 as a reflecting optical member of the -type optical system (catadioptric system), which constitutes the projection optical system PL, is held by the holder 40, which will be described below in detail.

Figure 3A:
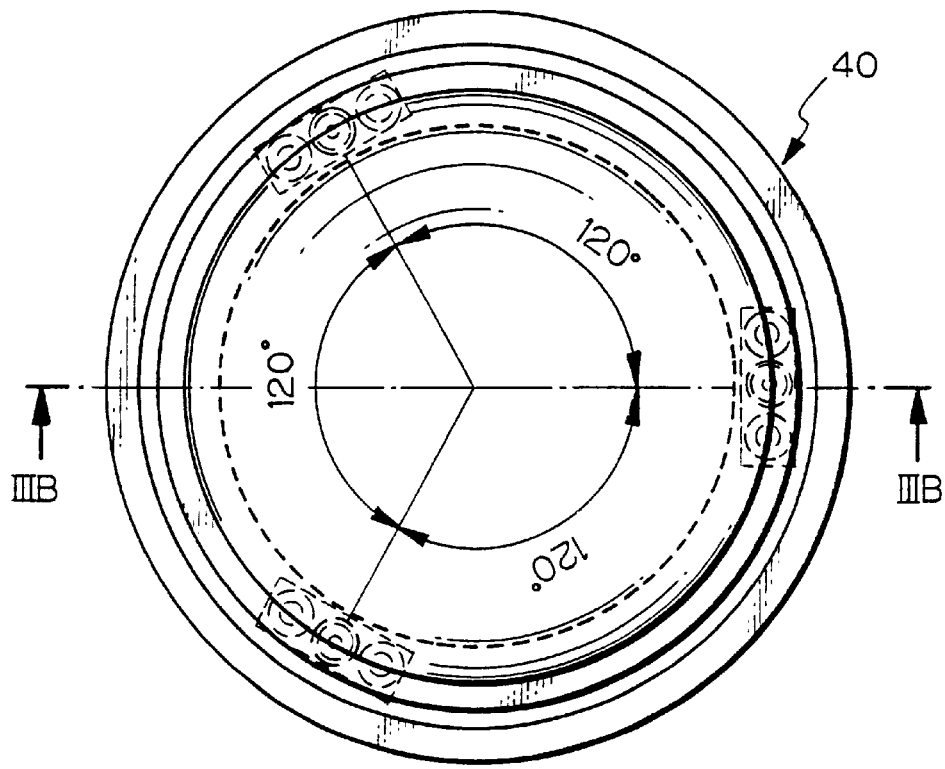
Figure 3B:
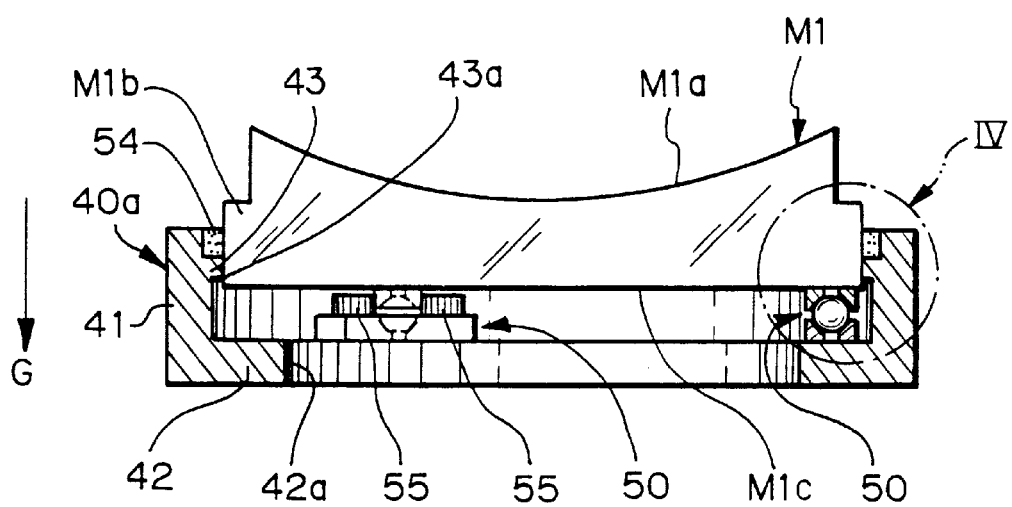

FIGS. 3(a) and 3(b) are diagrams showing the concave mirror M1 as supported by a holder 40 according to a first embodiment of the present invention. FIG. 3(a) is a top plan view of the concave mirror M1 supported by the holder 40. FIG. 3(b) shows the concave mirror M1 and the holder 40 in a sectional view taken along the line IIIB—IIIB in FIG. 3(a). It should be noted that the direction indicated by the arrow G in FIG. 3(b) is the direction of gravity.

The holder 40 comprises a support plate 40a and three support members 50, which are provided as constituent elements of a support mechanism. As shown in FIG. 3(b), the support plate 40a has a cylindrical portion 41 having an axis extending in the gravitational direction; a lower flange portion 42 provided at the lower end of the cylindrical portion 41 to extend perpendicularly to the gravitational direction; and an upper flange portion 43 formed near the upper end of the cylindrical portion 41. The lower flange portion 42 has a circular opening 42a, and the upper flange portion 43 also has a circular opening 43a.

The concave mirror M1 has a concave reflecting surface M1a coaxially formed on the upper side thereof. A flange portion M1b is formed over the entire circumference of the outer periphery of the concave mirror M1. The flange portion M1b has a thickness equal to that of the central portion of the concave mirror M1. The support members 50 are disposed on the upper surface of the lower flange portion 42 at respective positions that are directly below the outer edge of the reflecting surface M1a and that are at equal distances from the axis of the concave mirror M1 and at equal angular intervals, i.e. 120 degrees apart from each other. The outer periphery of the flange portion M1b is placed to face the inner periphery of the circular opening 43a of the support plate 40a, and the back surface M1c of the concave mirror M1 is supported by the support members 50. In this way, the concave mirror M1 is mounted on the support plate 40a.

Figure 4:
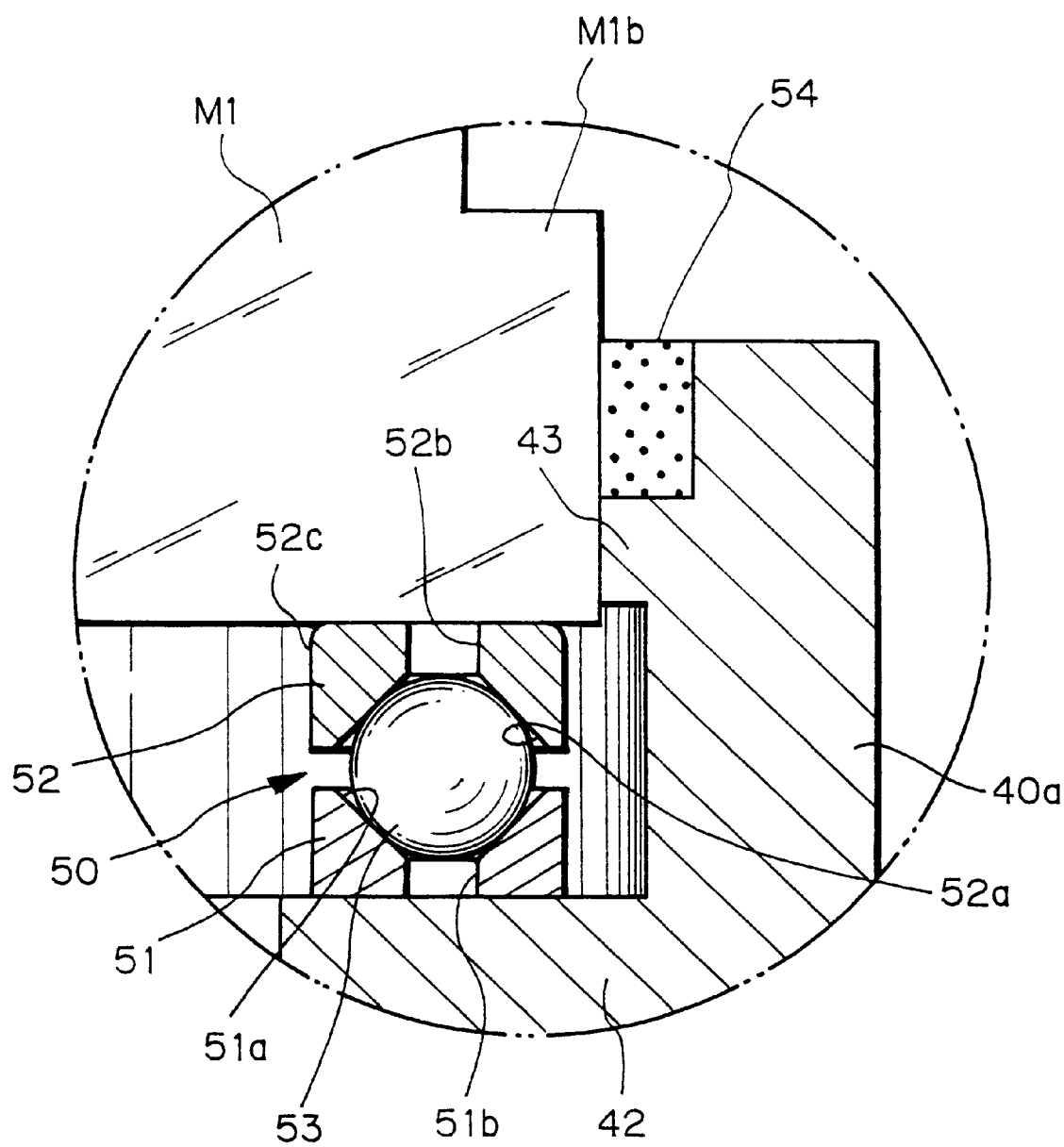
FIG. 4 is an enlarged view of a part indicated by the arrow IV in FIG. 3(b).

FIG. 4 is an enlarged view of a part indicated by the arrow IV in FIG. 3(b). Each support member 50 has a rectangular parallelepiped-shaped lower portion 51, a cylindrical upper portion 52, and a ball 53 disposed between the lower portion 51 and the upper portion 52. The lower portion 51 is secured to the lower flange portion 42 at both end portions thereof by two bolts 55 (FIG. 3(b)). The lower portion 51 has a conical surface 51a formed on the upper side thereof. The upper portion 52 is adapted to contact the back surface M1c of the concave mirror M1. The upper portion 52 also has a conical surface 52a formed on the lower side thereof. Because the upper portion 52 is movably supported by the lower portion 51 through the ball 53, the upper portion 52 is tiltable with respect to the lower portion 51 within a predetermined range. The two conical surfaces 51a and 52a have bores 51b and 52b formed in the respective centers as reliefs for cutting. It should be noted that the upper edge 52c of the upper portion 52 is chamfered (rounded) to facilitate the movement of the support member 50 relative to the concave mirror M1.

Referring to FIG. 3(b) again, a space surrounded by the upper flange portion 43 and the cylindrical portion 41 of the support plate 40a lies at the middle of the concave mirror M1 in the direction of the center thickness of the concave mirror M1, and the space is filled with a silicone adhesive 54 as a filler, thereby securing the concave mirror M1 to the support plate 40a.

In machining of the concave mirror M1, after a stock, e.g. Zerodur, has been machined to form a concave surface with a predetermined configuration, the stock is supported by a jig (not shown) having the same size and shape as those of the holder 40. Consequently, the stock is deflected in a trefoil shape by its own weight. That is, only the three points of the stock at which it is supported are relatively displaced upwardly by only a slight amount. The deflection is measured, and the deflected stock is correctively polished to obtain the desired concave surface. Thereafter, the concave surface is subjected to evaporation of aluminum coating, thereby forming the reflecting surface M1a. The reflecting surface M1a formed by such a process is not the optimum concave surface in a free state where the concave mirror M1 has just been taken out from the jig because portions of the reflecting surface M1a in the vicinities of the three points subjected to bearing force were correctively polished to a considerable extent. However, when the concave mirror M1 in such a condition is mounted into the holder 40 of the projection exposure apparatus such that the three support points of the concave mirror M1 during the machining process are coincident with those in the holder 40, the reflecting surface M1a is deflected by the weight of the concave mirror M1 so as to approach the optimum concave surface.

The back surface M1c of the concave mirror M1 is originally a plane surface, but when supported by the support members 50, the back surface M1c is slightly deformed by its own weight to become a curved surface having a large radius of curvature. Accordingly, if the support members 50 are immovably secured to the support plate 40a, undesired partial contact is likely to occur at the top of the upper portion 52 of each support member 50. Therefore, according to this embodiment, each support member 50 is arranged such that the upper portion 52 is tiltable with respect to the lower portion 51. Thus, even if the back surface M1c of the concave mirror M1 is deformed, the upper portion 52 of each support member 50 is allowed to tilt correspondingly to the deformation, thereby preventing the occurrence of partial contact.

If there is a change in the temperature of the atmosphere in the chamber, it is likely that the concave mirror M1 and the support members 50 will move relative to each other in the horizontal (XY) direction owing to the difference in the coefficient of thermal expansion between the material of the concave mirror M1 and the material of the support plate 40a. If the upper portion 52 of each support member 50 is left in the machined state and hence the upper edge 52c (FIG. 4) remains sharp, the upper edge 52c may cut into the back surface M1c of the concave mirror M1 to limit the relative movement of the concave mirror M1, causing the concave mirror M1 to be deformed. Therefore, the upper edge 52c of the upper portion 52 is chamfered to enable the concave mirror M1 and the upper portion 52 to move relative to each other smoothly even when the temperature changes, thereby preventing undesired deformation of the concave mirror M1.

The silicone adhesive 54 has such characteristics that the force of shrinkage upon setting is small, but the silicone adhesive 54 gives slight tensile force to the object to be bonded during setting. However, the concave mirror M1 has the flange portion M1b with the same thickness as that of the central portion thereof, and the middle of the flange portion M1b in the direction of the width thereof is secured by the silicone adhesive 54. Therefore, the stresses acting on the upper and lower surfaces of the concave mirror M1 become approximately equal to each other. Accordingly, it is possible to prevent the reflecting surface M1a from being unevenly deformed.

Incidentally, according to the embodiment shown in FIGS. 3(a) and 3(b), the reproducibility of deflection of the concave mirror M1 is ensured when it is incorporated in the projection exposure apparatus 10. However, because the concave mirror M1 is supported at the vicinity of the outer periphery thereof, the deflection of the central portion of the concave surface may become large when the concave mirror M1 is supported at the three points. As the deflection becomes large, the amount by which the stock is correctively polished increases, causing the throughput to reduce. Such a problem can be solved by a second embodiment of the present invention described below.

Figure 5A:
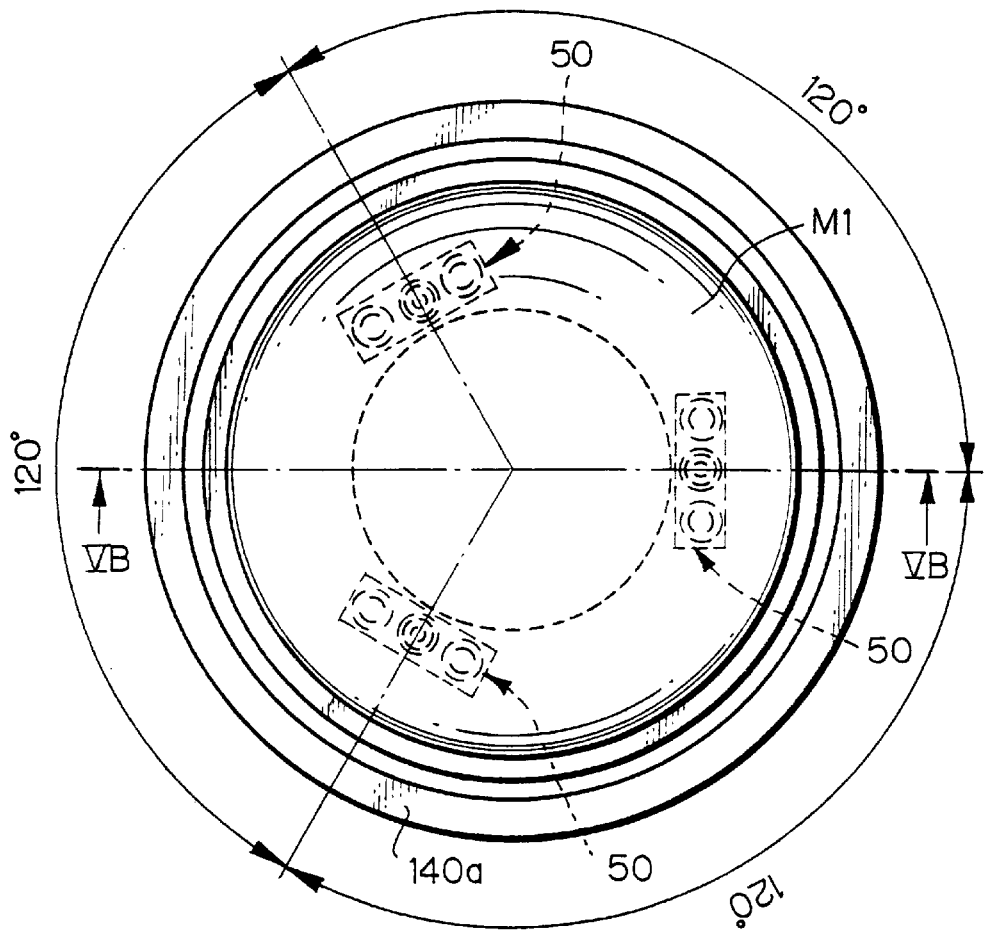
Figure 5B:
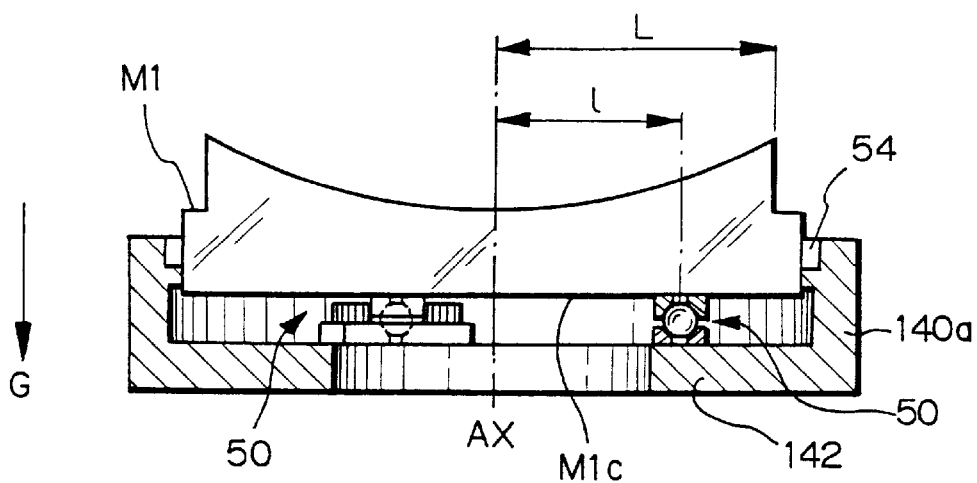

FIGS. 5(a) and 5(b) are diagrams showing the concave mirror M1 as supported by a holder according to the second embodiment of the present invention. FIG. 5(a) is a top plan view of the concave mirror M1 supported by the holder. FIG. 5(b) shows the concave mirror M1 and the holder in a sectional view taken along the line VB—VB in FIG. 5(a). It should be noted that the same portions as those in the first embodiment are denoted by the same reference characters, and a detailed description thereof is omitted.

The second embodiment shown in FIGS. 5(a) and 5(b) differs significantly from the first embodiment in the position at which each support member 50 supports the back surface M1c of the concave mirror M1. As shown in FIG.

5(b), the support plate 140a has a lower flange portion 142 extending more inwardly than the lower flange portion 42 of the support plate 40a according to the first embodiment. The support members 50 are disposed on the upper surface of the lower flange portion 142 at respective positions which are a distance away from the optical axis AX. Simulation results revealed that the deflection was smallest when =77 millimeters under the conditions that the outer diameter 2L of the concave mirror M1 was 250 millimeters, the curvature R of the concave surface was 357.2 millimeters, and the center thickness was 40 millimeters. In such a case, the ratio of the distance to the radius L of the concave mirror M1 is /L=0.616. It should be noted that calculations were performed by using Young's modulus: E=9,286 kgf/mm², Poisson's ratio: 0.24, and specific gravity: 2.53 g/cm³, as physical properties of Zerodur used as a material.

Thus, the deflection of the concave mirror M1 can be minimized by appropriately setting the ratio of the distance to the concave mirror radius L according to the design values of the concave mirror M1. Consequently, the amount by which the stock is correctively polished can be reduced, and thus throughput can be improved.

Figure 6A:
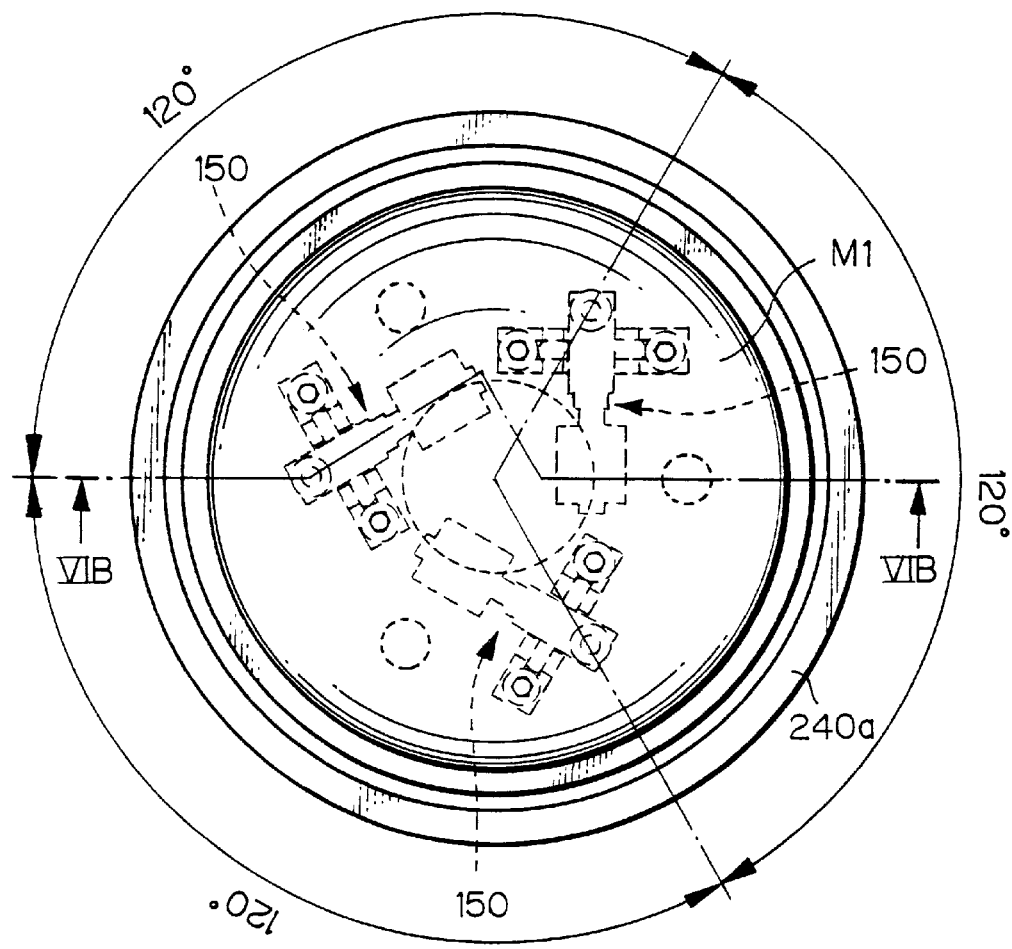
Figure 6B:
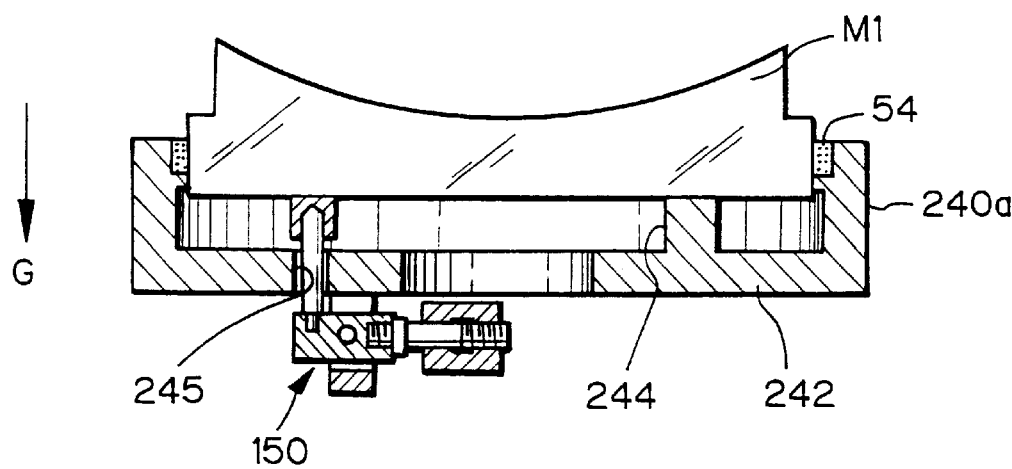

FIGS. 6(a) and 6(b) are diagrams showing the concave mirror M1 as supported by a holder according to a third embodiment of the present invention. FIG. 6(a) is a top plan view of the concave mirror M1 and the holder. FIG. 6(b) show the concave mirror M1 and the holder in a sectional view taken along the line VIB—VIB in FIG. 6(a). It should be noted that the same portions as those in the first embodiment are denoted by the same reference characters, and a detailed description thereof is omitted.

The third embodiment shown in FIGS. 6(a) and 6(b) differs considerably from the foregoing embodiments in the number of support points at which the concave mirror M1 is supported. Theoretically, the larger the number of support points, the smaller the deflection of the object supported. However, in the case of a rigidly supporting structure, physically the most stable support can be obtained when the object is supported at three points. Therefore, when it is intended to increase the number of support points more than three, elastic supports must be provided at support points other than the three. However, if the concave mirror M1 is supported by using springs or rubber members, the bearing force will undesirably change owing to deterioration with time. This may cause the deflection of the concave mirror M1 to change such that the configuration of the reflecting surface is not optimum. It is also conceivable to support the concave mirror M1 by using pneumatic pressure or the like. In such a case, however, it is necessary to change the pressure delicately according to changes in atmospheric pressure or other environmental conditions. Therefore, an advanced control mechanism will be needed. The third embodiment makes it possible to support the concave mirror M1 at a multiplicity of points in excess of three points while solving the above-described problem.

In the third embodiment shown in FIGS. 6(a) and 6(b), the support plate 240a has a lower flange portion 242 provided with three fixed support portions 244 which are formed at equal distances from the optical axis and at equal angular intervals, i.e. 120 degrees. Further, the lower flange portion 242 has three bores 245 formed at equal distances from the optical axis and each positioned between a pair of adjacent fixed support portions 244. In addition, a support member 150 is disposed on the lower surface of the lower flange portion 242 in the vicinity of each bore 245. In other words, the concave mirror M1 is supported at six points by the three fixed support portions 244 as support members and three cylindrical members 156 (described later) as pressing mechanisms.

Figure 7A:
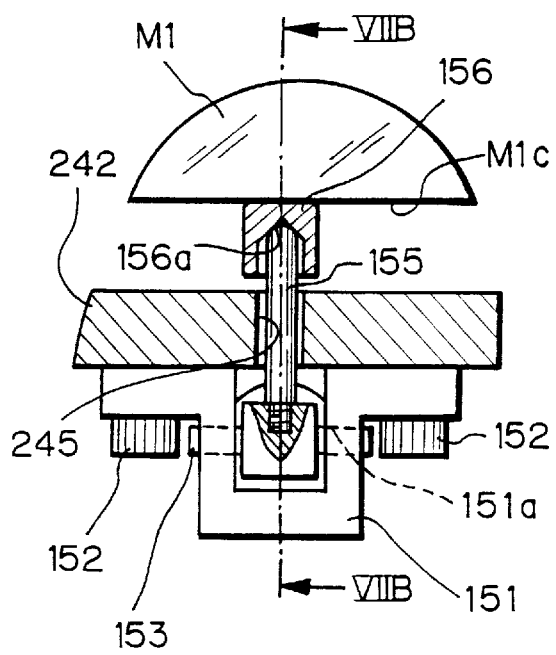
Figure 7B:
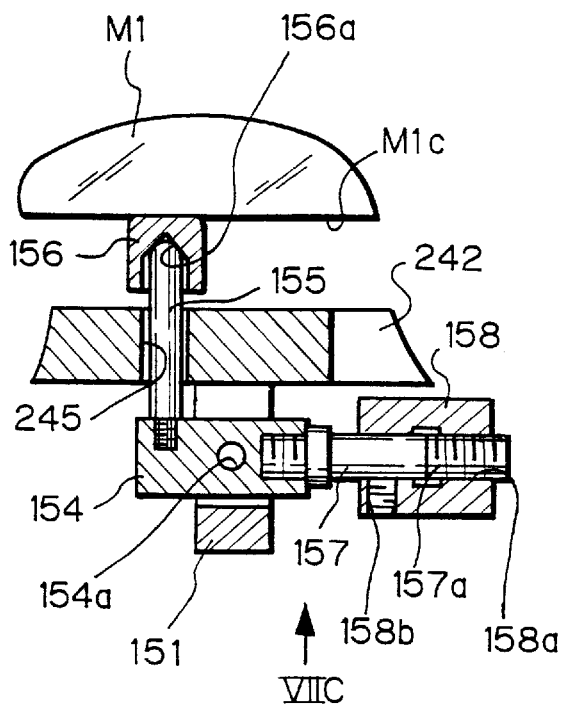
Figure 7C:
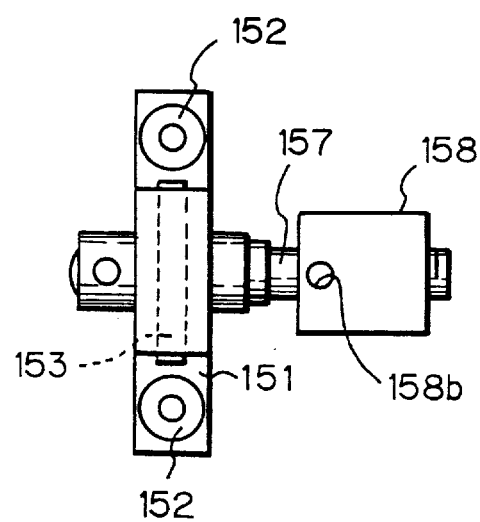

FIGS. 7(a), 7(b) and 7(c) are diagrams showing a support member 150 as an adjusting mechanism mounted on the lower flange portion 242. FIG. 7(a) is a front view of the support member 150. FIG. 7(b) is a sectional view of the support member 150 taken along the line VIIB—VIIB in FIG. 7(a). FIG. 7(c) is a diagram showing the support member 150 as seen from the direction of the arrow VIIC in FIG. 7(b).

Referring to FIGS. 7(a), 7(b) and 7(c), a holder member 151 with a U-shaped sectional configuration is secured to the lower surface of the lower flange portion 242 by using two bolts 152. The holder member 151 is provided with a bore 151a extending horizontally through both leg portions thereof. The bore 151a has a shaft 153 inserted therein. The shaft 153 extends through a bore 154a formed in a transmission arm 154 extending across the holder member 151. Accordingly, the transmission arm 154 is rotatable about the shaft 153 clockwise or counterclockwise as viewed in FIG. 7(b) until it comes in contact with the holder member 151.

A rod member 155 as a pressing member is screwed into the upper surface at the left end of the transmission arm 154 as shown in FIG. 7(b). The rod member 155 extends vertically upward through a bore 245. The rod member 155 has a spherical upper end that is in contact with the back surface M1c of the concave mirror M1 through a cylindrical member 156. The distance from the optical axis to the center of the cylindrical member 156 is equal to the distance from the optical axis to each fixed support portion 244. It should be noted that the cylindrical member 156 has a conical surface 156a formed on the inner surface thereof. The upper edge of the cylindrical member 156 is chamfered. Accordingly, the cylindrical member 156 is tiltable with respect to the back surface M1c of the concave mirror M1 and also movable relative to the back surface M1c as in the case of the foregoing embodiments.

A rod-shaped screw member 157 is screwed into the right end of the transmission arm 154 as shown in FIG. 7(b). The screw member 157 extends horizontally. The screw member 157 has an external thread 157a formed on the distal end thereof. A hollow cylindrical weight member 158 has an internal thread 158a formed in the right end thereof as shown in FIG. 7(b). The weight member 158 is secured to the screw member 157 by engaging the external thread 157a and the internal thread 158a with each other. The weight member 158 has an internally threaded bore 158b formed in the left end thereof as shown in FIG. 7(b). The internally threaded bore 158b extends from the outer periphery of the left end of the weight member 158 toward the screw member 157. By screwing a bolt (not shown) into the internally threaded bore 158b, the weight member 158 can be locked.

If the weight member 158 is rotated around the screw member 157, the weight member 158 is displaced in the axial direction relative to the screw member 157 according to the screw pitch, resulting in a change in the distance from the shaft 153 as a fulcrum to the center of gravity of the weight member 158, that is, leverage. Thus, it is possible to adjust the bearing force transmitted from the rod member 155 to the back surface M1c of the concave mirror M1 through the cylindrical member 156. In the case of the six-point supporting structure, the amount of deflection of the concave mirror M1 is minimized by setting the bearing force at ⅙ of the weight of the concave mirror M1. In comparison to a case where the concave mirror M1 is supported at three points, for example, the six-point supporting structure enables the amount of deflection of the concave mirror M1 to reduce to about 1/10 in a simple calculation.

The bearing force transmitted from the rod member 155 to the concave mirror M1 does not change with time in contrast to supporting structures using springs or pneumatic pressure and is therefore stable for a long period of time and need not be finely adjusted. Even if the rod member 155 or the cylindrical member 156 becomes deformed by fatigue such that the vertical length thereof shortens, because the weight of the weight member 158 and the leverage are constant, the bearing force transmitted from the rod member 155 to the concave mirror M1 is constant at all times. It should be noted that the higher the leverage, the more the weight of the weight member 158 can be reduced, and this is advantageous from the viewpoint of design. However, in a case where acceleration due to vibrations is likely to act in the vertical direction, the leverage is preferably set at 1.

The supporting structure in which the concave mirror M1 is supported at six points as described above is superior in some aspects to a supporting structure in which the back surface of the concave mirror M1 is supported by using, for example, a cushion or the like. That is, if a cushion or like is used, the concave mirror M1 can be supported at the whole surface, but there may be a change in the position of the concave mirror M1 in the optical axis direction due to deterioration with time or other cause. It should be noted that it is desirable from the viewpoint of minimizing the amount of deflection to dispose the support points away from the optical axis by a distance about 0.6 times the distance from the optical axis to the outer periphery of the concave mirror M1. However, because the amount of deflection in the six-point supporting structure is smaller than in the case of the three-point supporting structure, the support points may be disposed at outer positions, for example, near the outer periphery of the concave mirror M1. The number of non-fixed supports using the support members 150 is not necessarily limited to three but may be more than three.

Figure 8A:
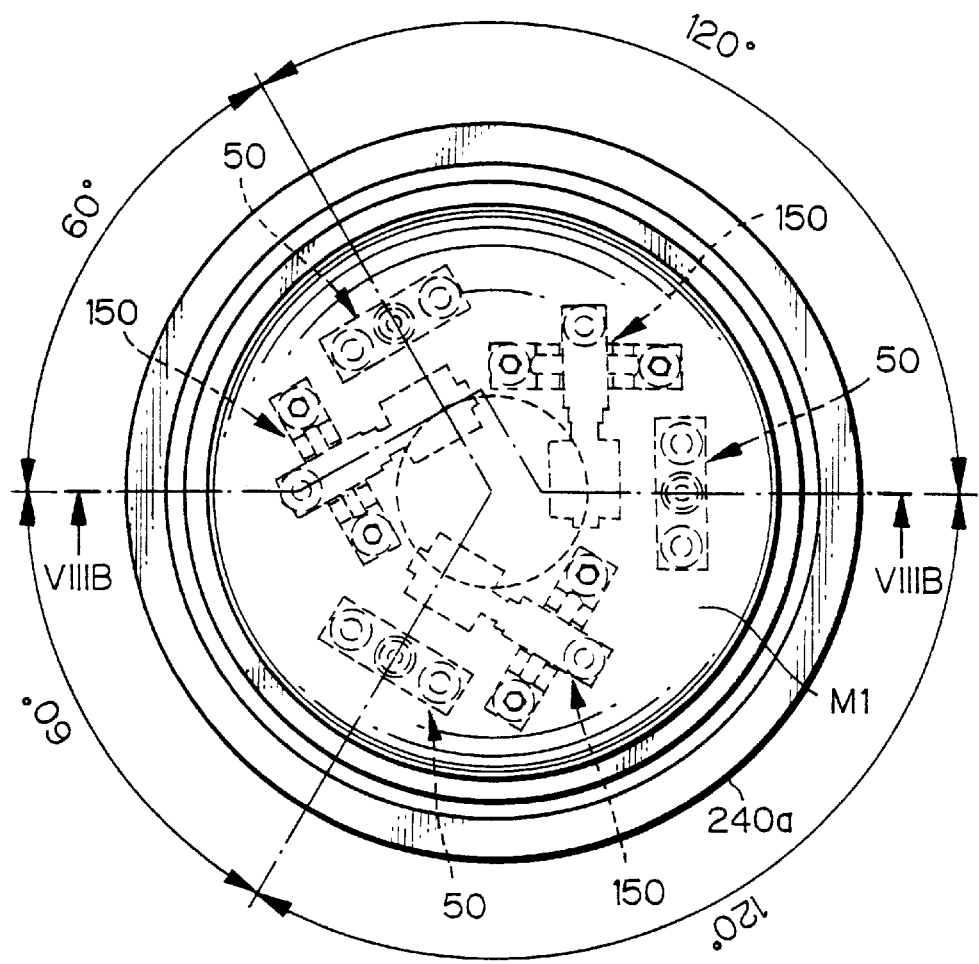
Figure 8B:
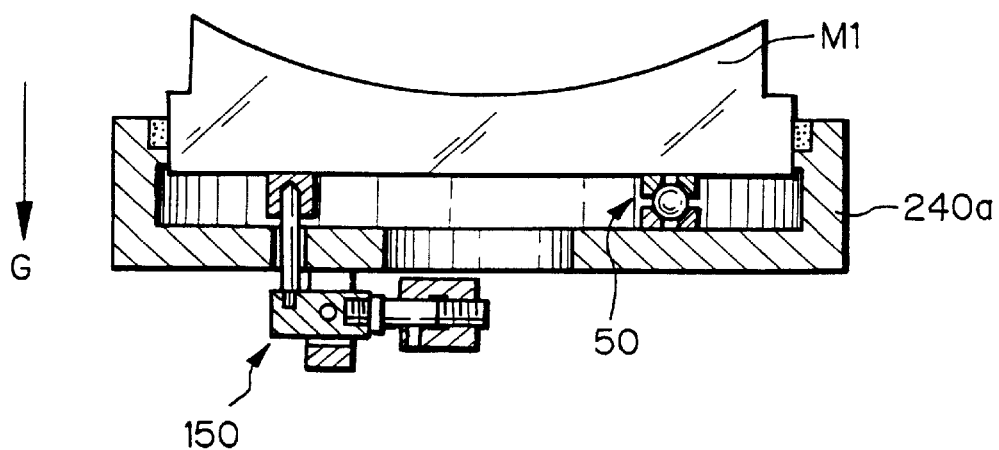

FIGS. 8(*a*) and 8(*b*) are diagrams showing the concave mirror M1 as supported by a holder according to a fourth embodiment of the present invention. FIG. 8(*a*) is a top plan view of the concave mirror M1 supported by the holder. FIG. 8(*b*) shows the concave mirror M1 and the holder in a sectional view taken along the line VIIIB—VIIIB in FIG. 8(*a*). It should be noted that the same portions as those in the third embodiment are denoted by the same reference characters, and a detailed description thereof is omitted.

The fourth embodiment shown in FIGS. 8(*a*) and 8(*b*) differs largely from the third embodiment in that the support members 50 as shown in FIG. 3(*b*) are provided in place of the fixed support portions 244. More specifically, the upper portion 52 (see FIG. 4) of each support member 50 is tiltable with respect to the back surface M1*c* of the concave mirror M1 and also movable relative to the back surface M1*c*.

Figure 9A:
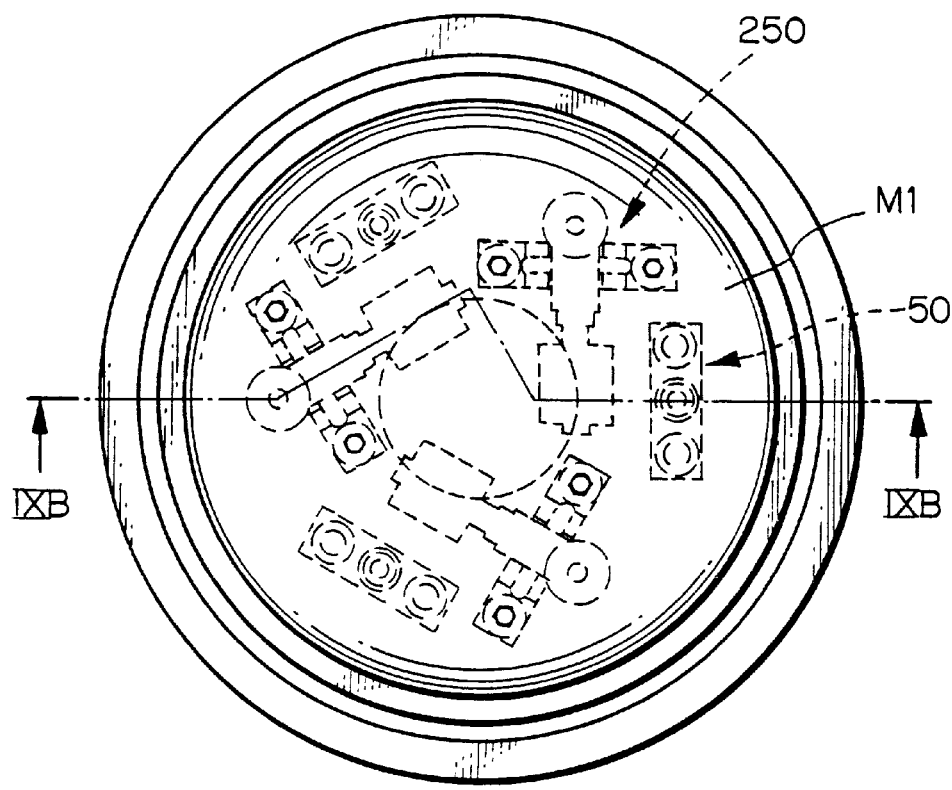
Figure 9B:
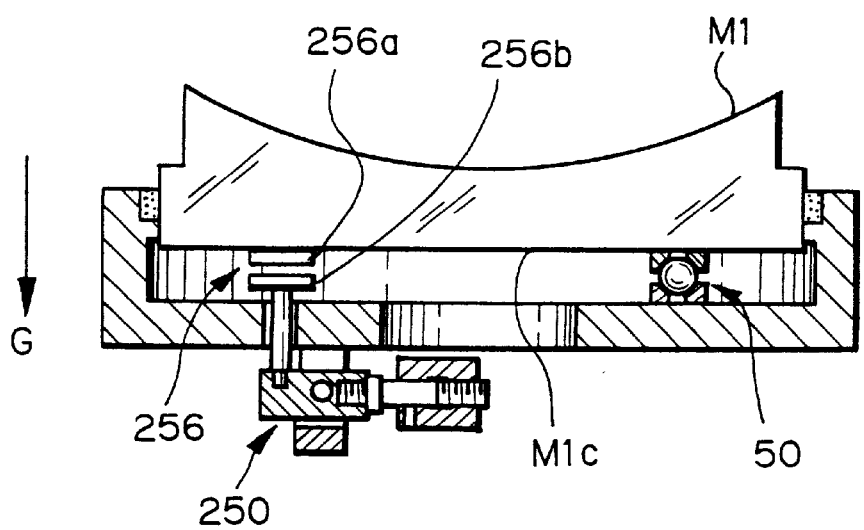

FIGS. 9(*a*) and 9(*b*) are diagrams showing the concave mirror M1 as supported by a holder according to a fifth embodiment of the present invention. FIG. 9(*a*) is a top plan view of the concave mirror M1 supported by the holder. FIG. 9(*b*) shows the concave mirror M1 and the holder in a sectional view taken along the line IXB—IXB in FIG. 9(*a*). It should be noted that the same portions as those in the fourth embodiment are denoted by the same reference characters, and a detailed description thereof is omitted.

The fifth embodiment shown in FIGS. 9(*a*) and 9(*b*) differs considerably from the fourth embodiment in that a permanent magnet set 256 having magnet pieces 256*a* and 256*b* is provided at the distal end of a rod member of each support member in place of the cylindrical member 156. More specifically, a disk-shaped magnet piece 256*b* is secured to the upper end of a rod member 255 of each support member 250, and a disk-shaped magnet piece 256*a* is secured to the back surface M1*c* of the concave mirror M1 such that magnetic poles of the same sign (e.g. North poles) face opposite to each other.

In the fourth embodiment shown in FIGS. 8(*a*) and 8(*b*), each cylindrical member 156 is always in contact with the back surface M1*c* of the concave mirror M1. Therefore, when there is a difference in thermal expansion due to a temperature change, the concave mirror M1 may be deformed by force acting thereon in the horizontal direction owing to frictional force occurring between the concave mirror M1 and the cylindrical members 156.

In contrast, according to the fifth embodiment shown in FIGS. 9(*a*) and 9(*b*), repulsion force of the permanent magnet set 256 is acting between the rod member 255 of each support member 250 and the back surface M1*c* of the concave mirror Ml; therefore, even if there is a difference in thermal expansion, only force acting in the vertical direction is transmitted from the rod member 255 to the concave mirror M1. Thus, deformation of the concave mirror M1 can be prevented. It should be noted that the magnetic piece 256*a* is preferably bonded to the back surface M1*c* of the concave mirror M1 by using a silicone adhesive, which gives relatively small shrinkage force during setting. However, when the bond area is small, for example, it is possible to use an epoxy adhesive, which has high adhesive power.

Although in the foregoing embodiments the present invention has been described with regard to a holder for a concave mirror used in a catadioptric system of a projection exposure apparatus, it should be noted that the present invention is not necessarily limited thereto but may be applied to various optical apparatuses, for example, reflecting telescopes which are required to have a reflecting optical system of high accuracy.

As has been described above, in the holder for a reflecting optical member according to the present invention, the support mechanism has support points lying on a circumference away from the center of the reflecting surface of the reflecting optical member by a distance at least 0.6 times the distance from the center of the reflecting surface to the outer periphery of the reflecting optical member. Therefore, the deflection of the reflecting optical member can be geometrically minimized. This makes it possible to minimize the amount by which the reflecting optical member is correctively polished during machining process. Because the support points are disposed on the circumference at equal intervals, the reflecting optical member is induced to deflect in point symmetry with respect to the optical axis. Thus, it is possible to reduce asymmetric components of deflection and to improve uniformity.

By virtue of the arrangement of the holder having a support plate that supports a reflecting optical member according to the present invention, the back surface of the reflecting optical member is, for example, fixedly supported by a three-point supporting structure, which enables physically the most stable support, and non-fixedly supported at other support points. By doing so, the reflecting optical member can be stably supported. The pressing force at each of the non-fixed support points can be adjusted by an adjusting mechanism to the same level as that of bearing force at each of the fixed support points. Consequently, the amount of deflection of the reflecting optical member at each support point can be made equal to each other, and thus the deflection of the reflecting optical member can be minimized even more effectively.

According to the exposure apparatus of the present invention in which an image of a pattern formed on a mask is transferred onto a photosensitive substrate, the support mechanism for a reflecting optical member has support points lying on a circumference away from the center of the reflecting surface of the reflecting optical member by a distance at least 0.6 times the distance from the center of the reflecting surface to the outer periphery of the reflecting optical member. Therefore, the deflection of the reflecting optical member can be geometrically minimized. This makes it possible to minimize the amount by which the reflecting optical member is correctively polished during machining process. Because the support points are disposed on the circumference at equal intervals, the reflecting optical member can be induced to deflect in point symmetry with respect to the optical axis. Thus, it is possible to reduce asymmetric components of deflection and to improve uniformity.

According to the exposure apparatus of the present invention in which an image of a pattern formed on a mask is transferred onto a photosensitive substrate, the back surface of the reflecting optical member is, for example, fixedly supported by a three-point supporting structure, which enables physically the most stable support, and non-fixedly supported at other support points. By doing so, the reflecting optical member can be stably supported. The pressing force at each of the non-fixed support points can be adjusted by an adjusting mechanism to the same level as that of bearing force at each of the fixed support points. Consequently, the amount of deflection of the reflecting optical member at each support point can be made equal to each other, and thus the deflection of the reflecting optical member can be minimized even more effectively.

Next, a projection exposure apparatus to which another holder for a reflecting optical member according to the present invention is applied will be described with reference to FIGS. 10 to 14.

Figure 10:
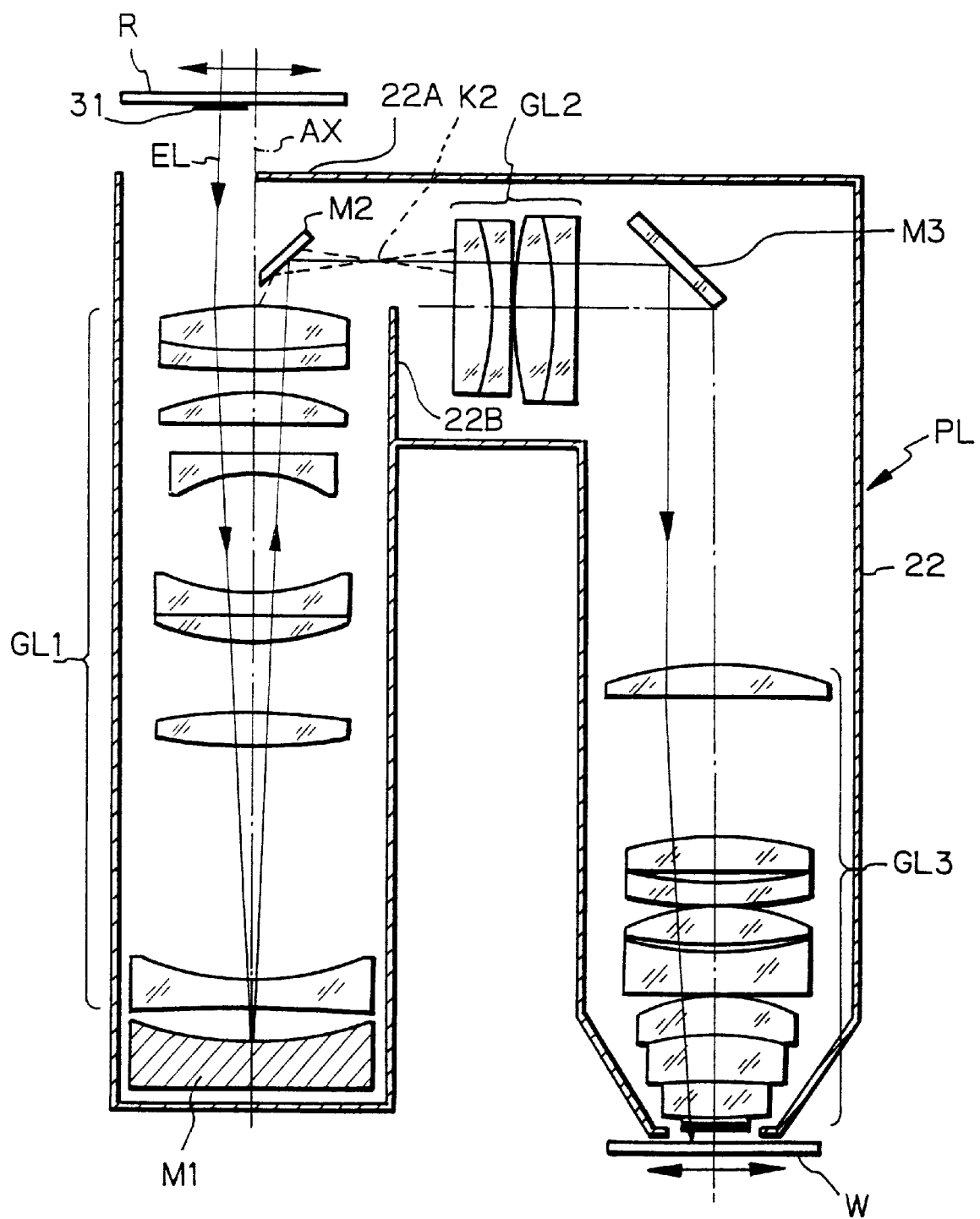
FIG. 10 is an enlarged view of a projection optical system in the projection exposure apparatus shown in FIG. 1, which is similar to the projection optical system shown in FIG. 2.

FIG. 10 shows a projection optical system PL approximately similar to the projection optical system shown in FIG. 2. A concave mirror M1 held by another holder according to the present invention is disposed directly below a first lens unit GL1. Unlike the arrangement shown in FIG. 2, a plane mirror M2 is disposed in a pupil plane of the projection optical system PL above the first lens unit GL1.

In the projection optical system PL, a conjugate point K2 that is conjugate with the surface of the wafer W with respect to exposure light is present on the optical axis AX of exposure light between the plane mirror M2, which is disposed in the pupil plane, and a second lens unit GL2.

The projection exposure apparatus 10 according to this embodiment is arranged as described above, and a concave mirror M1 as a reflecting optical member of a -type optical system (catadioptric system) constituting the projection optical system PL is held by a reflecting mirror holder described below.

Figure 11A:
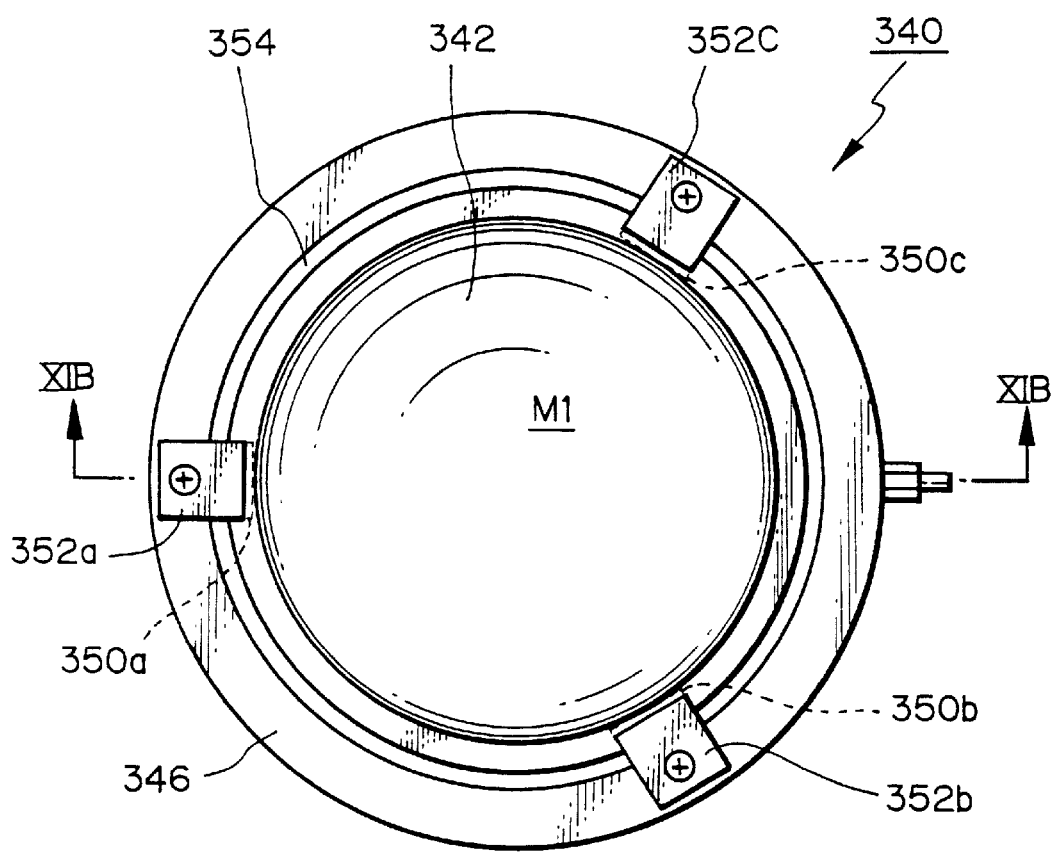
Figure 11B:
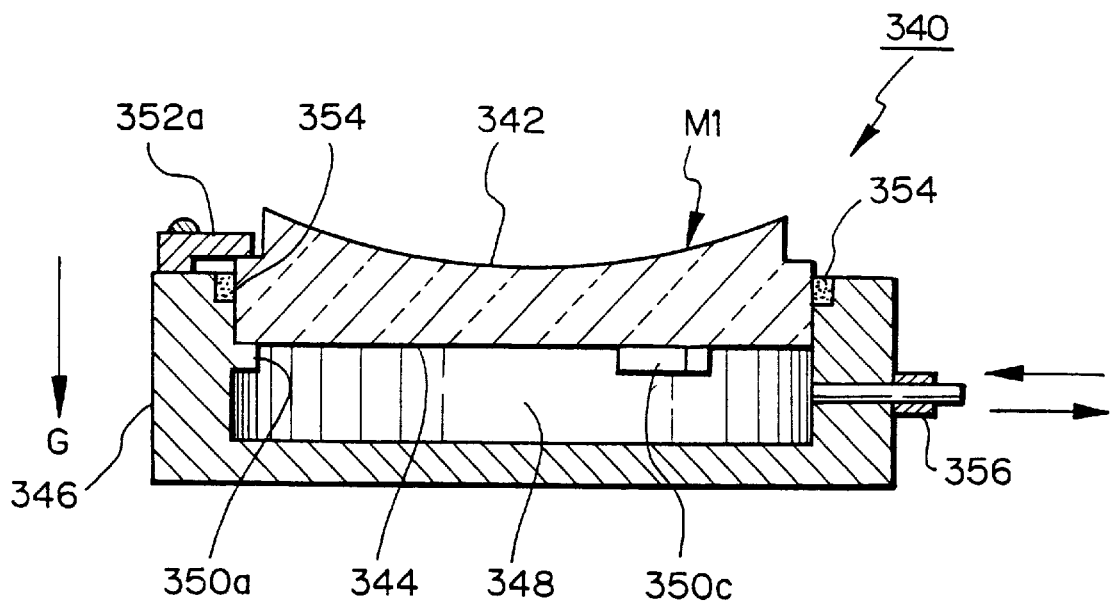

As shown for example in FIGS. 11(a) and 11(b), a reflecting mirror holder 340 includes a mirror frame 346 as a mirror holding member that holds the concave mirror M1 such that a mirror surface 342 of the concave mirror M1 faces outward, thereby forming a closed chamber 348 in combination with the concave mirror M1. The reflecting mirror holder 340 further includes seating surfaces 350a, 350b and 350c (in FIG. 11(b), 350b is not shown) that support the concave mirror M1 at three points. Pressing plates 352a, 352b and 352c (in FIG. 11(b), 352b and 352c are not shown) clamp the outer peripheral edge of the concave mirror M1 in combination with the seating surfaces 350a, 350b and 350c, respectively. Further, a filler 354 is filled in the space between the concave mirror M1 and the mirror frame 346 to improve hermeticity. A pneumatic joint 356 extends through a side wall of the mirror frame 346 to provide communication between the closed chamber 348 and the outside.

The concave mirror M1 has a mirror surface formed on a surface of a glass or ceramic material concavely polished with high accuracy by silver-alloy brazing or by evaporating or sputtering silver, aluminum, etc. In the concave mirror M1 shown in FIGS. 11(a) and 11(b), the mirror surface 342 and the back surface 344 have different surface configurations. In this embodiment, the back surface 344 is flat.

The mirror frame 346 comprises a cylindrical container, one end of which is closed. The concave mirror M1 is held by the mirror frame 346 in such a way that the outer peripheral surface of the mirror M1 internally touches the inner peripheral surface of the mirror frame 346 and the mirror surface 342 faces outward (upward as viewed in FIG. 11(b)). Thus, a closed chamber 348 is formed by the mirror frame 346 and the concave mirror M1. In this embodiment, the inside of the closed chamber 348 is communicated with the outside through the pneumatic joint 356. By causing a gas, e.g. air, to flow into and out of the closed chamber 348 through the pneumatic joint 356, the pressure in the closed chamber 348 can be regulated (the pressure regulating mechanism will be described later in detail). Thus, the concave mirror M1 shown in FIG. 11(b) is prevented from being deflected by its own weight. That is, the deflection of the concave mirror M1 due to its own weight is canceled by increasing the pneumatic pressure in the closed chamber 348 to thereby apply a pressure counter to the direction of gravity (G).

In this embodiment, the seating surfaces 350a, 350b and 350c are formed on the respective upper surfaces of three projections which are provided on the inner peripheral surface of the mirror frame 346 to project inwardly from respective positions circumferentially spaced at intervals of 120 degrees. The concave mirror M1 is supported at three points by the seating surfaces 350a, 350b and 350c (see FIG. 11(a)).

The pressing plates 352a, 352b and 352c are disposed to face opposite to the seating surfaces 350a, 350b and 350c, respectively. The pressing plates 352a, 352b and 352c pair with the seating surfaces 350a, 350b and 350c to clamp the concave mirror M1, thereby surely holding the concave mirror M1 (see FIG. 11(b)). The pressing plates 352a, 352b and 352c are firmly secured to the mirror frame 346 by using screws, respectively.

The filler 354 is a sealant filled in the space between the concave mirror M1 and the mirror frame 346 to improve hermeticity. Examples of sealants usable as the filler 354 are silicone and other fillers, packings of rubber and other materials, and a combination of these substances.

As shown in FIG. 11(b), the pneumatic joint 356 is a pipe extending through a side wall of the mirror frame 346 to provide communication between the closed chamber 348 and the outside, thereby enabling a fluid, e.g. air, to flow into and out of the closed chamber 348.

Figure 12:
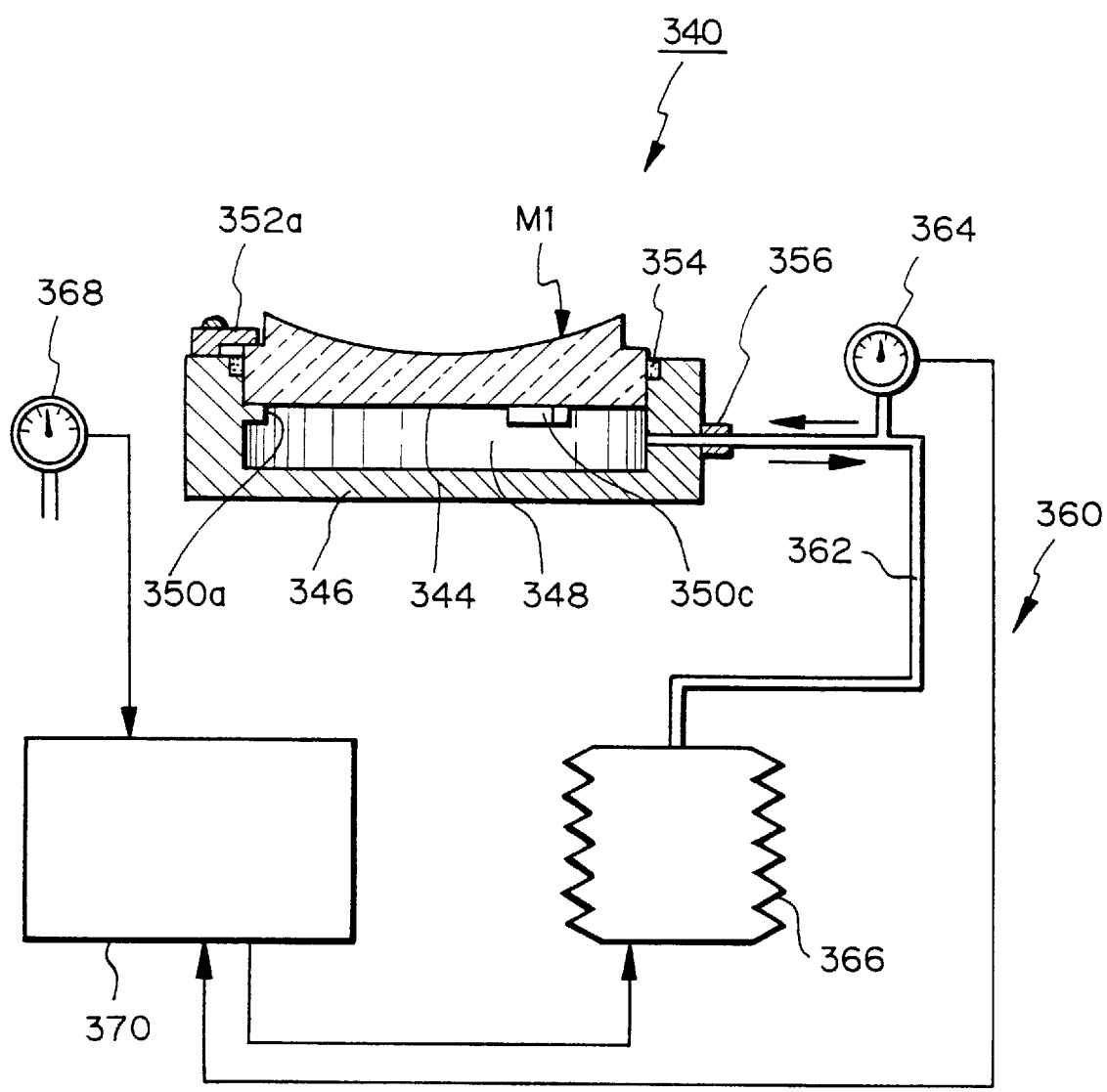
FIG. 12 is a schematic view for explanation of the holder shown in FIGS. 11(a) and 11(b) and a mechanism that controls the pressure in a closed chamber of the holder.

The reflecting mirror holder 340 is arranged as described above. FIG. 12 shows a pneumatic pressure regulating mechanism 360 as a pressure control system that regulates the pneumatic pressure in the closed chamber 348 through the pneumatic joint 356, in addition to a reflecting mirror holder 340 as shown in FIGS. 11(a) and 11(b). The reflecting mirror holder 340 shown in FIG. 12 is the same as that shown in FIGS. 11(a) and 11(b); therefore, a description of the arrangement thereof is omitted, and the pneumatic pressure regulating mechanism 360 will be mainly described below.

The pneumatic pressure regulating mechanism 360 has a closed chamber pressure gauge 364, a bellows pump 366, an atmospheric pressure gauge 368, a control unit 370, etc. It should be noted that the pneumatic joint 356 of the reflecting mirror holder 340, the closed chamber pressure gauge 364 and the bellows pump 366 are connected by a pneumatic pressure regulating pipe 362. The bellows pump 366 causes a gas, e.g. air, to flow into and out of the closed chamber 348 of the reflecting mirror holder 340 through the pneumatic pressure regulating pipe 362, thereby regulating the pressure in the closed chamber 348.

The closed chamber pressure gauge 364 is connected to a branched portion of the pneumatic pressure regulating pipe 362 at an intermediate position between the pneumatic joint 356 and the bellows pump 366. Thus, the closed chamber pressure gauge 364 is in communication with the closed chamber 348 and hence capable of measuring the pressure in the closed chamber 348.

The bellows pump 366 is a pneumatic pressure pump as a pressure regulating device which can apply either a positive or negative pressure as desired by causing a gas, e.g. air, to flow into and out of the closed chamber 348 of the reflecting mirror holder 340 through the pneumatic pressure regulating pipe 362.

The atmospheric pressure gauge 368 is a pressure gauge that measures the gas pressure outside the reflecting mirror holder 340.

The control unit 370 comprises a microcomputer (or a minicomputer) including a CPU (Central Processing Unit), a ROM, a RAM, etc. and calculates a difference between the inside- and outside- gas pressures on the basis of the measured value of the gas pressure in the closed chamber 348, which is measured by the closed chamber pressure gauge 364, and the measured value of the atmospheric pressure, which is measured by the atmospheric pressure gauge 368. The inside- and outside-gas pressure difference is a relative pressure difference between the gas pressure in the closed chamber 348 and the atmospheric pressure, which is corresponds to the pressure applied vertically to the concave mirror M1. Accordingly, the control unit 370 regulates the pressure in the closed chamber 348 on the basis of the inside- and outside-gas pressure difference such that force equivalent to the gravity acting on the concave mirror M1 (i.e. force acting downward as viewed in FIG. 12) is canceled by force produced from the above-described pressure difference. Thus, the control unit 370 drives the bellows pump 366 to regulate the pressure in the closed chamber 348 such that the inside- and outside-gas pressure difference is constant at all times. Therefore, the deflection of the concave mirror M1 due to its own weight is canceled, and favorable optical performance can be obtained.

In this embodiment, the control of pressure in the closed chamber 348 is executed in real time. Therefore, even if the inside- and outside-gas pressure difference has changed with variations in the atmospheric pressure or owing to the thermal expansion of air or other gas in the closed chamber 348, the pressure control is effected in real time to cope with the change of the pressure difference, thereby enabling the inside- and outside-gas pressure difference to be kept constant at all times. Thus, the concave mirror M1 can exhibit favorable optical performance.

Figure 13:
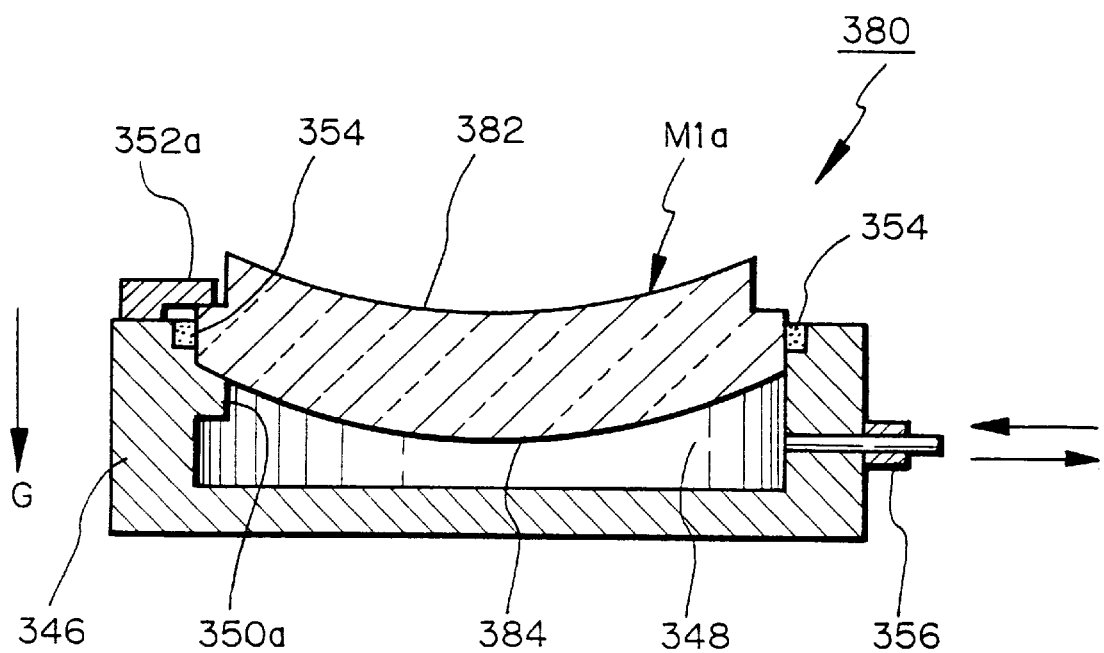
FIG. 13 is a sectional view showing the concave mirror in FIG. 10 as supported by a holder according to a seventh embodiment of the present invention.

FIG. 13 shows a reflecting mirror holder 380 according to another embodiment of the present invention. In the embodiment shown in FIG. 13, the same or equivalent constituent portions as those in FIGS. 11(a) and 11(b) are denoted by the same reference characters, and a description of the arrangements thereof is omitted.

The feature of the reflecting mirror holder 380 shown in FIG. 13 resides in that the mirror surface 382 and back surface 384 of a concave mirror M1a held by the reflecting mirror holder 380 are made equal to each other in the surface configuration (curvature), thereby making the thickness in the gravitational direction of the concave mirror M1a uniform at all portions thereof. By doing so, the gravity (G) acting on each portion of the concave mirror M1a is made uniform. Therefore, the effect of gravity can be canceled simply by regulating the pressure in the closed chamber 348 that acts on the back surface 384 of the concave mirror M1a. More specifically, the pressure acting on the back surface 384 of the concave mirror M1a can be applied thereto only uniformly because of the characteristics of pressure. Therefore, the reflecting mirror holder 380 according to this embodiment is arranged such that the gravity (G), which is to be canceled, is made uniform. Although in FIG. 13 a concave mirror is illustrated as an example, the arrangement according to this embodiment is particularly effective for plane mirrors and also concave and convex mirrors of large radius of curvature, which are close to plane mirrors. The arrangement in which the mirror surface 382 and the back surface 384 have the same surface configuration is advantageous in that the mirror can be readily machined.

Figure 14:
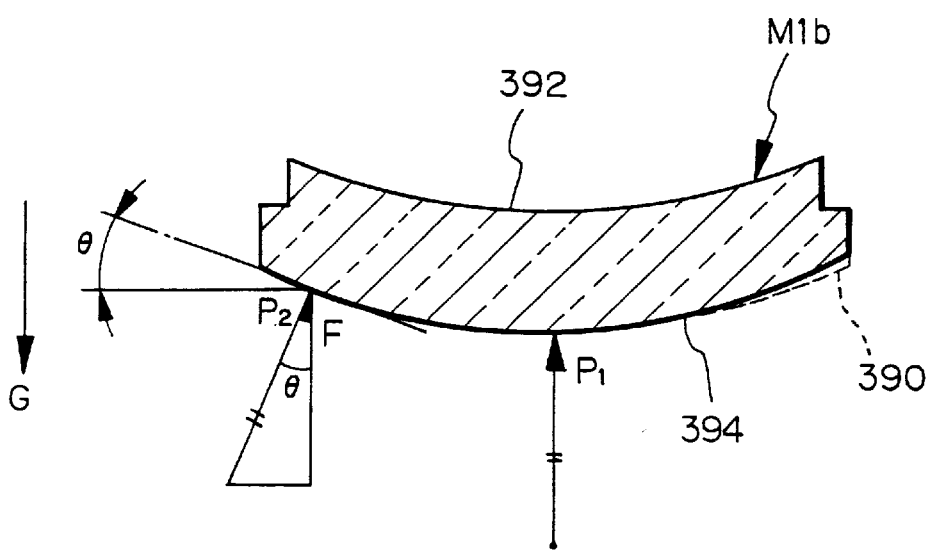
FIG. 14 is a diagram for explanation of the relationship between the gravitational force acting on a concave mirror having a smaller radius of curvature than that of the concave mirror shown in FIG. 13 and the pressure in the closed chamber.

FIG. 14 shows a concave mirror M1b having a smaller radius of curvature than that of the concave mirror M1a shown in FIG. 13 (it should be noted that the concave mirrors in FIGS. 13 and 14 are depicted with the same radius of curvature for the sake of description). FIG. 14 shows the relationship between the gravity (G) acting on the concave mirror M1b and the pressure P (pneumatic pressure in this example) applied by the closed chamber (not shown) to cancel the gravity (G).

As shown in FIG. 14, if the thickness in the gravitational direction of the concave mirror M1b is made uniform, the gravity (G) acting on the central portion of the concave mirror M1b and the gravity (G) acting on each end portion thereof become the same. However, because the concave mirror M1b shown in FIG. 14 has a smaller radius of curvature than that of the concave mirror M1a shown in FIG. 13, the slope of the back surface 394 becomes steeper as the distance from the center of the surface configuration increases toward the peripheral portion thereof. Meanwhile, the pneumatic pressure acting on the back surface 394 always acts uniformly on the back surface 394 in a direction perpendicular to it. Therefore, the pneumatic pressure P1 acting on the central portion of the concave mirror M1b shown in FIG. 14 is equal to the pneumatic pressure P2 acting on the curved left end portion (P1=P2). However, the gravity (G) always acts vertically (downwardly as viewed in the figure). Therefore, if the pressure control is effected such that the gravity (G) is canceled by force (F) counteracting it at the central portion of the concave mirror M1b (P1=P2=G), the force (F) at each end portion is F=P2 cosO- and always F<P2. Accordingly, the effect of the gravity that is not canceled appears as deflection more remarkably as the distance from the center of the concave mirror M1b increases toward each end portion thereof. In the case of the concave mirror M1a as shown in FIG. 13 and a convex mirror having a large radius of curvature, and a plane mirror, the effect of the gravity left uncanceled is weak; therefore, there is substantially no deterioration of the optical performance.

Conversely, if the pressure control is effected such that the effect of the gravity (G) is canceled at each end portion of the concave mirror M1b (F=G), the pneumatic pressure (P1) exceeds the gravity (G) at the central portion (P1>G). Consequently, the effect of deflection due to the pneumatic pressure appears in the central portion.

Accordingly, in a case where the back surface 394 of the concave mirror M1b has a small radius of curvature as shown in FIG. 14, it is desirable to partially varying the thickness in the gravitational direction of the concave mirror M1b to thereby effect optimization such that the effect of the gravity (G) is properly canceled by the pneumatic pressure (P). For example, in a case where there is a deficiency of the pressure (F) for canceling the gravity (G) in the vicinities of both ends of the concave mirror M1b as shown in FIG. 14, the concave mirror M1b is formed such that the thickness thereof becomes thinner as the distance from the center of the concave mirror M1b increases toward the peripheral portion thereof (see the cut portion 390 shown by the dashed line in FIG. 14). Consequently, the gravity (G) acting on the peripheral portion of the concave mirror M1b reduces, so that the gravity (G) can be canceled by the pressure (F) on an equality with each other.

If the pressure control is effected such that the effect of the gravity (G) is canceled at each end portion of the concave mirror M1b, the pneumatic pressure (P1) at the central portion exceeds the gravity (G). Therefore, the effect of deflection due to the pneumatic pressure is canceled by increasing the thickness of the central portion of the concave mirror M1a to increase the gravity (G) acting on the central portion (illustration of this arrangement is omitted).

In the foregoing embodiment shown in FIG. 13, the description has been mainly made of the characteristic arrangement of the reflecting mirror holder 380. The control of pressure in the closed chamber 348 is performed by the same arrangement and operation as in the case of the pneumatic pressure regulating mechanism 360 shown in FIG. 12; therefore, a description thereof is omitted.

As has been stated above, in the holder for a reflecting mirror used in the catadioptric system of the projection exposure apparatus 10 according to this embodiment, the wall of the closed chamber 348 at one end thereof in the gravitational direction is formed by a reflecting mirror (e.g. a concave mirror or a plane mirror), and the pressure in the closed chamber 348 at the back of the reflecting mirror is regulated by the pressure regulating mechanism 360, thereby enabling a pressure to be applied directly to the back of the reflecting mirror. Therefore, the deflection of the reflecting mirror due to its own weight is effectively canceled, and favorable optical performance can be maintained. Consequently, when an exposure process is carried out by a projection exposure apparatus using the reflecting mirror holder, a pattern image can be transferred onto the wafer W with high accuracy and at high resolution.

The projection exposure apparatus 10 according to this embodiment has a catadioptric system in which there are a plurality of reflections (three reflections) as a projection optical system PL thereof, and the abovedescribed reflecting mirror holder is used for the first reflecting optical element. Therefore, a pattern image entered into the projection optical system PL is first reflected by the reflecting mirror of high accuracy. Accordingly, it is possible to realize an exposure process of high accuracy that is only slightly affected by the deflection of the mirror surface.

In the foregoing embodiments shown in FIGS. 11(a), 11(b) and FIG. 13, the concave mirror M1 (the concave mirror M1a in the case of FIG. 13) constitutes the wall of the closed chamber 348 at the upper end thereof in the gravitational direction. However, the arrangement shown in FIG. 11(b) or FIG. 13 may be inverted. That is, the concave mirror M1 may constitute the wall of the closed chamber 348 at the lower end thereof in the gravitational direction. The gravity acting on the concave mirror M1 in this case acts in a direction in which the mirror surface is expanded. Therefore, the pressure control is effected such that the inside of the closed chamber 348 is held under a negative pressure. Consequently, force acts so as to lift the concave mirror M1 placed at the lower side of the closed chamber 348, and thus the effect of the gravity can be canceled.

In the foregoing embodiments, a difference between the gas pressures inside and outside the closed chamber 348 is measured in real time, and the control of pressure in the closed chamber 348 is performed on the basis of the result of the measurement. Therefore, it is possible to cancel a deflection component affected by variations in the atmospheric pressure. However, the present invention is not necessarily limited to the pressure control performed in real time. Whether or not to control the pressure in the closed chamber 348 in real time should be decided according to the demanded accuracy and the length of time within which a deflection component to be canceled may occur. In a case where real-time pressure control is not performed, an insideand outside-gas pressure difference should be measured at intervals of a predetermined period of time to control the pressure in the closed chamber 348. In this case also, the intervals of time at which the pressure control is carried out may be varied according to the demanded accuracy.

Although in the foregoing embodiments the reflecting mirror holder is arranged such that the pressure in the closed chamber 348 can be appropriately regulated, it should be noted that under circumstances where there is substantially no change in environmental conditions (outside-gas pressure, temperature, etc.), the pressure in the closed chamber 348 need not be changed; therefore, it is possible to use a closed chamber 348 in which the gas pressure has previously been adjusted to a predetermined level.

Although in the foregoing embodiments a gas, e.g. air or nitrogen gas, is used as a fluid that is sent into and discharged from the closed chamber 348 to effect pressure control, the fluid usable in the present invention is not necessarily limited to such a gas, and that a predetermined liquid may be supplied into the closed chamber 348 to control the pressure applied to the back of the reflecting mirror. If a liquid used as a fluid for pressure control is cooling water, it is possible to cool the reflecting mirror M1 directly from the back thereof and hence possible to prevent the temperature of the concave mirror M1 from being raised by light (e.g. ArF excimer laser) reflected by the reflecting mirror M1. Accordingly, it becomes possible to prevent deterioration of the optical performance of the reflecting mirror M1 due to thermal expansion.

Although in the foregoing embodiments the concave mirror M1 is taken as an example of the reflecting mirror held by the holder according to the present invention, it should be noted that the present invention is not necessarily limited to a concave mirror, and that a plane mirror or a convex mirror can also be effectively held without being affected by deflection due to its own weight.

Although in the foregoing embodiments a reflecting mirror constituting a projection optical system of a projection exposure apparatus used as a semiconductor manufacturing system is held by the holder according to the present invention, it should be noted that the range of application of the present invention is not necessarily limited thereto, and that the present invention is also applicable to liquid-crystal display devices using reflecting mirrors, reflecting telescopes, and various other optical equipment demanded to have an optical system of high accuracy.

Next, a projection exposure apparatus to which another holder for a reflecting optical member according to the present invention is applied will be described with reference to FIGS. 15 and 16.

The projection exposure apparatus 10 according to this embodiment has a projection optical system PL which is a -type optical system (catadioptric system) and which has a plane mirror M2 as a reflecting optical member.

Figure 15A:
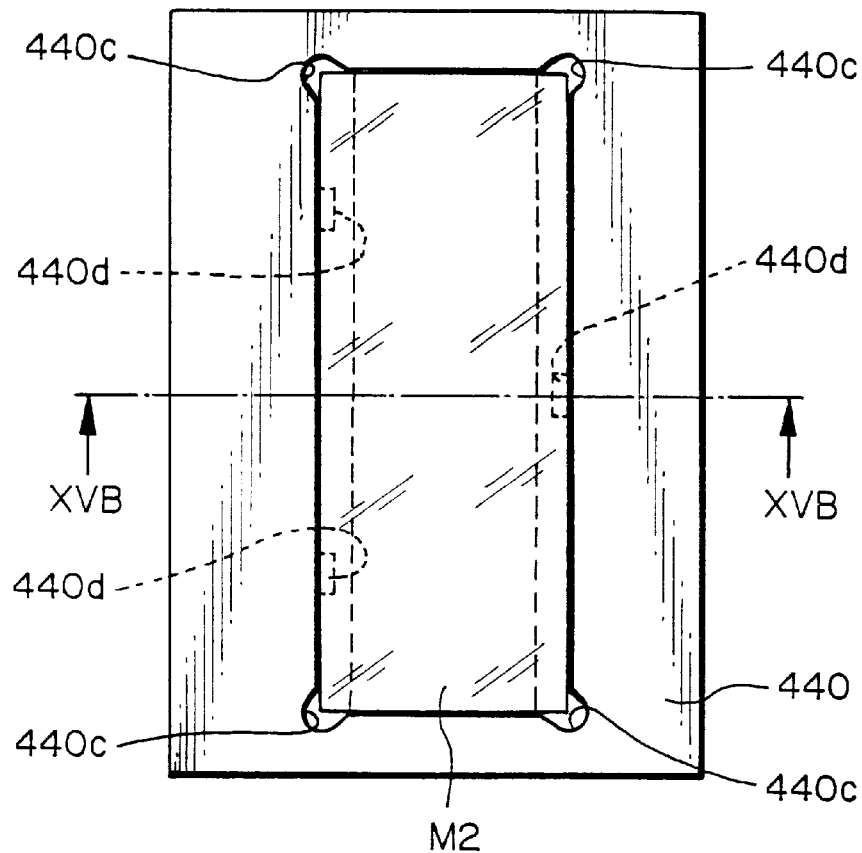
Figure 15B:
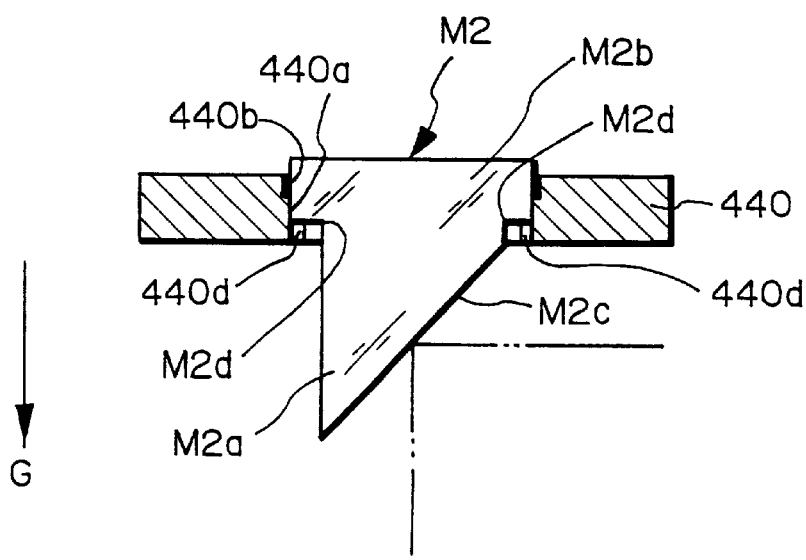

FIGS. 15(a) and 15(b) are diagrams showing a plane mirror M2 as supported by a support frame according to this embodiment. FIG. 15(a) is a top plan view of the plane mirror M2 supported by the support frame. FIG. 15(b) shows the plane mirror M2 and the support frame in a sectional view taken along the line XVB—XVB in FIG. 15(a). It should be noted that the direction indicated by the arrow G in FIG. 15(b) is the gravitational direction.

Figure 19A:
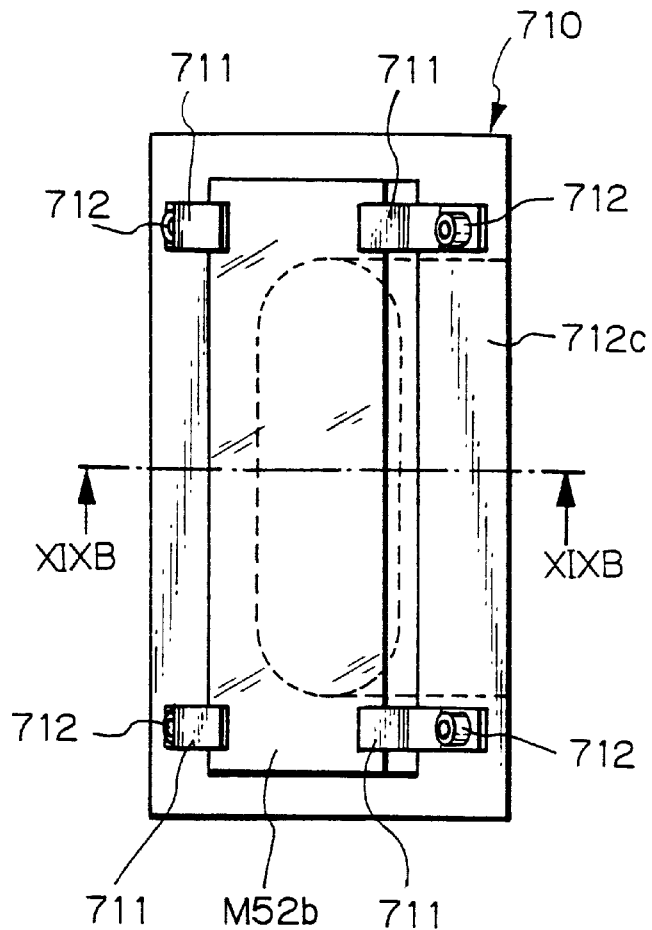
Figure 19B:
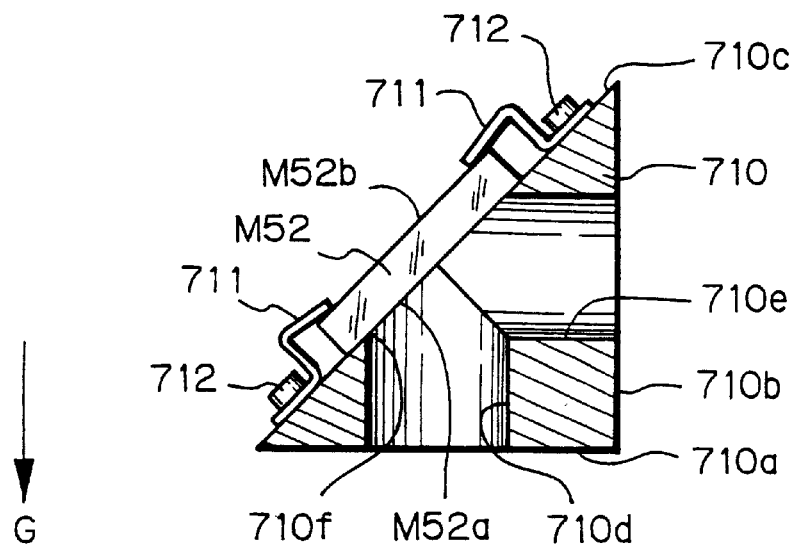

The plane mirror M2 has a prism-shaped body portion M2a and a flat plate portion (mounting portion) M2b with a greater width than that of the body portion M2a. The flat plate portion M2b is overlaid on the body portion M2a. The body portion M2a and the flat plate portion M2b are integrally formed from a material, e.g. Zerodur. The body portion M2a has aluminum coating evaporated on a slant surface M2c to form a flat mirror surface. It should be noted that the plane mirror M2 having a prism configuration exhibits higher rigidity than a flat plate-shaped plane mirror such as that shown in FIG. 19(b). Consequently, the surface accuracy of the mirror surface can be further improved.

A support frame 440 for the plane mirror M2 is a rectangular flat plate having a rectangular opening 440a provided in the center thereof. The rectangular opening 440a has a shape and size adequate to accommodate the flat plate portion M2b of the plane mirror M2. The upper edge of the rectangular opening 440a is provided with a groove 440b extending over the entire periphery of the opening 440a. Further, cut portions 440c as reliefs for machining are formed in the four corners of the rectangular opening 440a. The lower edge of the rectangular opening 440a is provided with a total of three projections 440d, i.e. one projection 440d on the right-hand edge portion as viewed in FIG. 15(a) and two projections 440d on the left-hand edge portion. It should be noted that the two left projections 440d are equidistantly away from the longitudinal center of the rectangular opening 440a and are away from each other by a distance 0.6 times the longitudinal length of the rectangular opening 440a. The right projection 440d is located at the longitudinal center of the rectangular opening 440a.

To the support frame 440 disposed at a predetermined position in the projection exposure apparatus, the plane mirror M2 is fitted by being inserted into the rectangular opening 440a from above in such a posture that the mirror surface M2c faces downward as viewed in FIG. 15(b). Further, the body portion M2a of the plane mirror M2 is passed through the rectangular opening 440a until the flat plate portion M2b abuts on the projections 440d. In this state, the groove 440b is filled with a silicone adhesive (not shown), thereby securing the periphery of the flat plate portion M2b to the rectangular opening 440a, and thus completing the assembly.

In such an assembled state, the flat plate portion M2b is fitted to the inner periphery of the rectangular opening 440a and is therefore unlikely to rattle in the horizontal direction. Regarding the plane mirror M2, the left-hand side thereof, which needs relatively large bearing force, is supported at two points by the left projections 440d, while the right-hand side of the plane mirror M2, which needs relatively small bearing force, is supported at one point by the right projection 440d, thereby balancing the bearing forces. Moreover, the plane mirror M2 is supported by the left projections 440d, which are equidistantly away from the longitudinal center of the rectangular opening 440a and are away from each other by a distance 0.6 times the longitudinal length of the rectangular opening 440a, whereby the deflection of the plane mirror M2 due to the bearing force is minimized on the basis of the principle of Bessel point. It should be noted that because the number of rigid-body support points which provides a physically stable condition is three, only one support point is provided on the right side and positioned in the center of the rectangular opening 440a, thereby obtaining symmetric deflection.

In the plane mirror M2 according to this embodiment, the flat plate portion (mounting portion) M2b is provided away from the reflecting surface M2c. Therefore, even when a space for mounting cannot sufficiently be ensured in the vicinity of the reflecting surface M2c in the projection optical system PL, for example, the reflecting surface M2c can be disposed at such a position.

Further, it is unnecessary to use securing members, e.g. bolts or springs, to mount the plane mirror M2 on the support frame 440. The plane mirror M2 can be secured to the support frame 440 simply by hanging the former on the latter. Accordingly, it is possible to reduce the internal stress in the plane mirror M2 induced by mounting. When the plane mirror M2 is mounted on the support frame 440, a position where the highest stress is set up is a notched portion M2d between the body portion M2a and the flat plate portion M2b. Accordingly, as the distance from the notched portion M2d increases, the distribution of internal stresses in the plane mirror M2 becomes gentler. The internal stress can be reduced by providing the notched portion M2d with a radius. According to this embodiment, because the plane mirror M2 is a prism-shaped mirror, the reflecting surface M2c is distant from the notched portion M2d. Therefore, the amount of deformation of the reflecting surface M2c due to the stress is small. It should be noted that if the reflecting surface M2c is provided at a very low position to minimize the amount of deformation due to the stress, the weight of the plane mirror M2 increases, and this may cause the stress in the notched portion M2d to become excessively large.

Figure 16A:
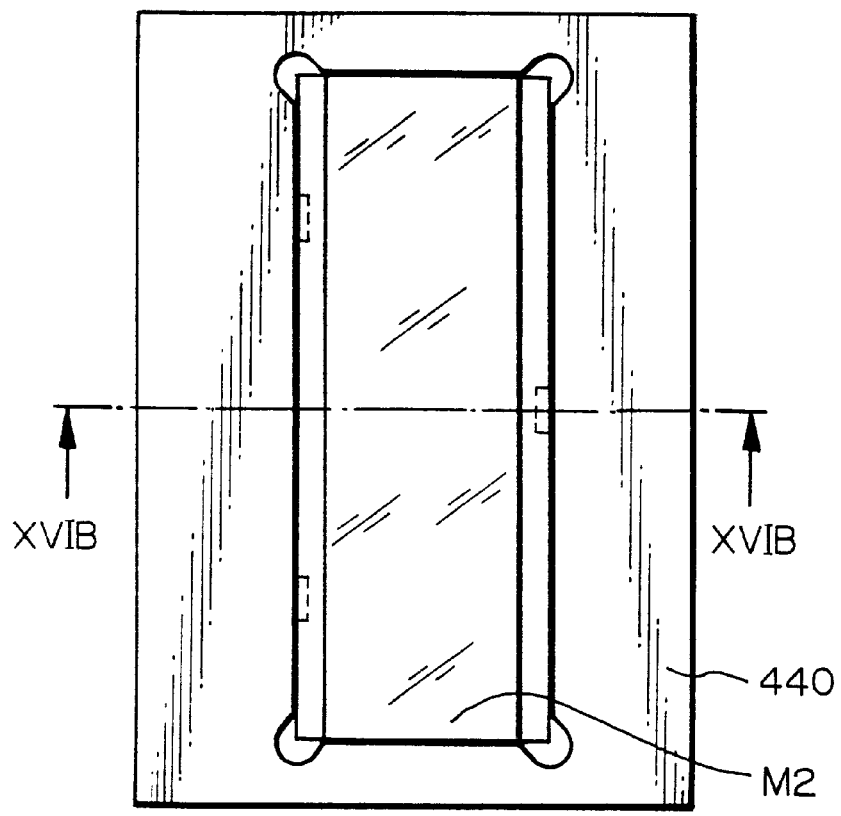
Figure 16B:
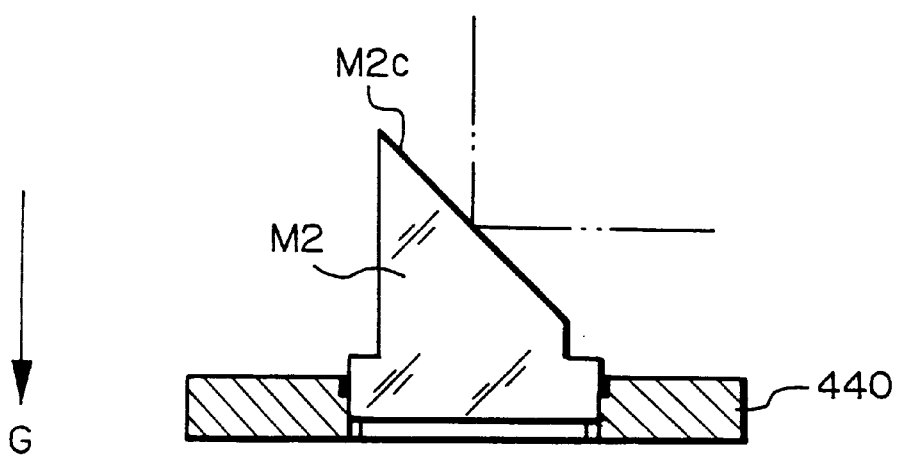
Figure 17A:
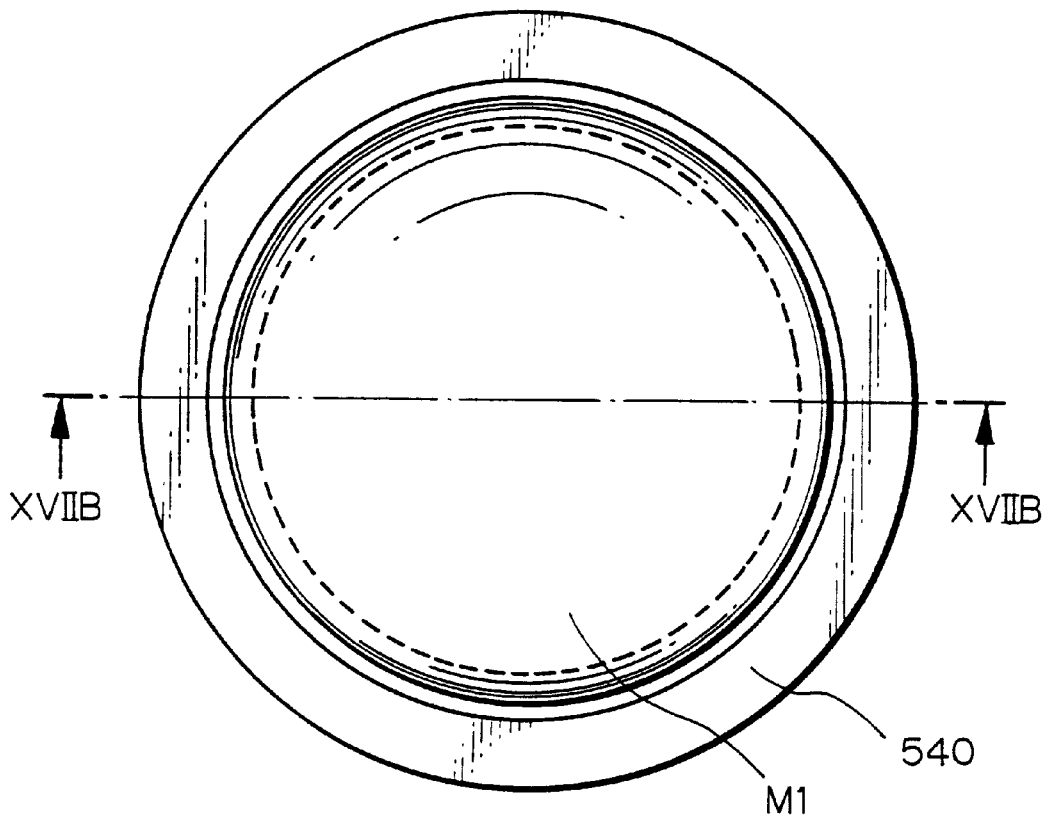
Figure 17B:
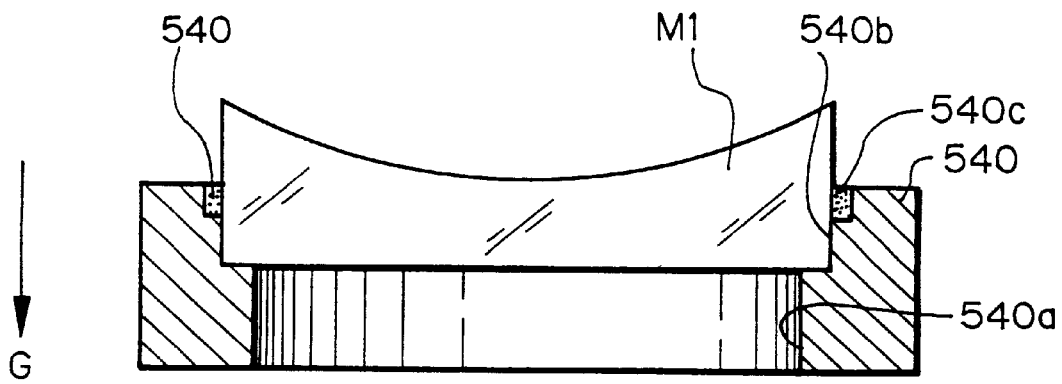
Figure 18A:
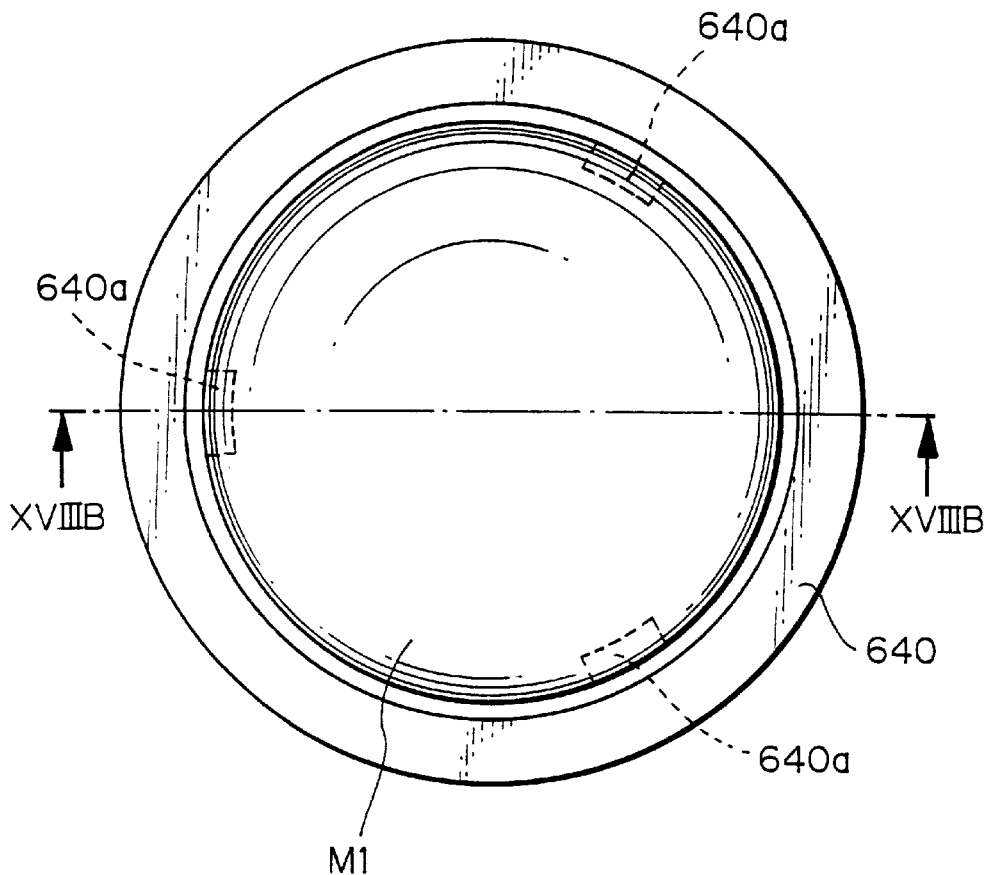
Figure 18B:
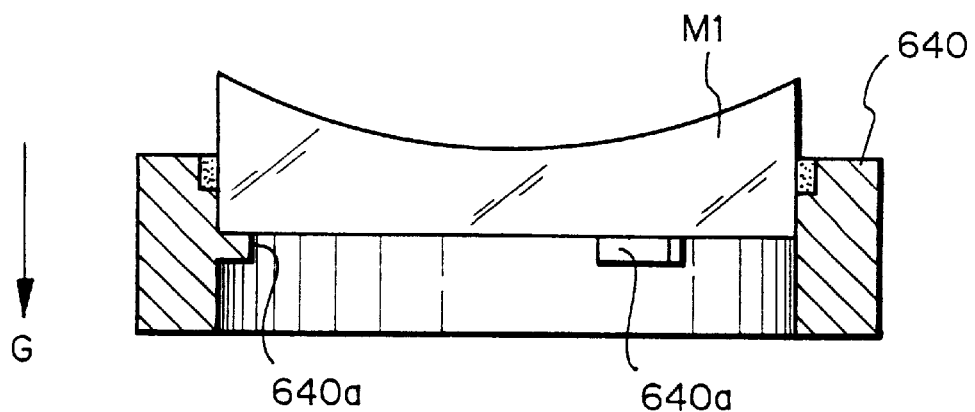

FIGS. 16(a) and 16(b) are diagrams showing a plane mirror M2 as supported by a support frame according to another embodiment. FIG. 16(a) is a top plan view of the plane mirror M2 supported by the support frame. FIG. 16(b) shows the plane mirror M2 and the support frame in a sectional view taken along the line IVB—IVB in FIG. 16(a).

The embodiment shown in FIGS. 16(a) and 16(b) differs from the embodiment shown in FIGS. 15(a) and 15(b) in the posture of the plane mirror M2 when mounted on the support frame 440. That is, in the two embodiments, both the plane mirror M2 and the support frame 440 have the same arrangements, respectively. However, in the latter embodiment, the plane mirror M2 is mounted into the support frame 440 upside down, i.e. in an inverse relation to the plane mirror M2 in the former embodiment. In the former embodiment, the plane mirror M2 bends light downwardly. To bend light upwardly, the latter embodiment is effectively used.

It should be noted that to secure the flat plate portion M2b to the support frame 440, a silicone adhesive is used because it gives relatively small shrinkage force during setting. However, when the bond area is small, for example, it is possible to use an epoxy adhesive, which has high adhesive power.

Although in the foregoing embodiments the present invention has been described with regard to a holder for a plane mirror used in a catadioptric system of a projection exposure apparatus, it should be noted that the present invention is not necessarily limited thereto but may be applied to various optical apparatuses, for example, reflecting telescopes which are required to have a reflecting optical system of high accuracy.

As has been described above, in the exposure apparatus according to the present invention, a mounting portion is integrally formed on the reflecting optical member. Therefore, the reflecting optical member can be satisfactorily supported without providing, for example, a leaf spring, which may deform the reflecting optical member by applying bearing force to it. Consequently, it is possible to minimize the deformation of the reflecting optical member.

Although the present invention has been described by way of some embodiments, it should be noted that the present invention is not necessarily limited to the described embodiments, and that various changes and modifications may be imparted thereto without departing from the gist of the present invention set forth in the appended claims as the technical idea thereof.

What is claimed is:

1. A holder which holds a reflecting optical member, said holder comprising:
   a support mechanism which supports a back surface of said reflecting optical member, which is reverse to a reflecting surface of said reflecting optical member, at least three support points,
   said support points of said support mechanism being positioned on a circumference away from a center of said reflecting surface by a distance at least 0.6 times a distance from the center of said reflecting surface to an outer periphery of said reflecting optical member such that said support points are circumferentially spaced along said circumference at equal intervals.

2. A holder according to claim 1, wherein said support mechanism has a support plate and support members which support said reflecting optical member with respect to said support plate, each of said support members being non-fixed at least one of ends thereof which face said support plate and said reflecting optical member, respectively.

3. holder according to claim 2, wherein a filler is filled in a space between the outer periphery of said reflecting optical member and said support plate to hold the outer periphery of said reflecting optical member.

4. A holder having a support plate which supports a reflecting optical member, said holder comprising:
   support members which support a back surface of said reflecting optical member at least three support points;
   pressing mechanisms which press the back surface of said reflecting optical member at respective pressing points different from said support points; and
   an adjusting mechanism provided for each of said pressing mechanisms to adjust pressing force with which the associated pressing mechanism presses the back surface of said reflecting optical member.

5. A holder according to claim 4, wherein said support points and said pressing points lie on a same circumference a predetermined distance away from a center of said reflecting optical member, and said support points are circumferentially spaced along said circumference at equal intervals.

6. A holder according to claim 5, wherein said pressing mechanism includes a fulcrum provided on said support plate, a transmission arm pivotably mounted on said fulcrum, and a pressing member provided on one end of said transmission arm to press the back surface of said reflecting optical member at said pressing point, said pressing member including a rod member standing on said one end of said transmission arm, and
   said adjusting member including a weight member mounted on the other end of said transmission arm.

7. A holder according to claim 5, wherein said pressing mechanism includes a fulcrum provided on said support plate, a transmission arm pivotably mounted on said fulcrum, and a pressing member provided on one end of said transmission arm to press the back surface of said reflecting optical member at said pressing point, said pressing member including a pair of magnets magnetized with magnetic poles of a same sign, said magnets being respectively disposed on said transmission arm and the back surface of said reflecting optical member at said pressing point so as to face opposite to each other, and
   said adjusting member including a weight member mounted on the other end of said transmission arm.

8. A holder according to claim 4, wherein said pressing mechanism includes a fulcrum provided on said support plate, a transmission arm pivotably mounted on said fulcrum, and a pressing member provided on one end of said transmission arm to press the back surface of said reflecting optical member at said pressing point, said pressing member including a rod member standing on said one end of said transmission arm, and
   said adjusting member including a weight member mounted on the other end of said transmission arm.

9. A holder according to claim 4, wherein said pressing mechanism includes a fulcrum provided on said support plate, a transmission arm pivotably mounted on said fulcrum, and a pressing member provided on one end of said transmission arm to press the back surface of said reflecting optical member at said pressing point, said pressing member including a pair of magnets magnetized with magnetic poles of a same sign, said magnets being respectively disposed on said transmission arm and the back surface of said reflecting optical member at said pressing point so as to face opposite to each other, and
   said adjusting member including a weight member mounted on the other end of said transmission arm.

10. A holder which holds a reflecting optical member, said holder comprising:
    a holding member which supports said reflecting optical member and forms a closed chamber in combination with said reflecting optical member,
    wherein a pressure in said closed chamber at a back of a reflecting surface of said reflecting optical member is regulated to a predetermined level.

11. A holder according to claim 10, further comprising a pressure regulating device which regulates the pressure in said closed chamber to a predetermined level.

12. A holder according to claim 11, wherein said pressure regulating device is a pump which regulates the pressure in said closed chamber to a predetermined level by causing a fluid to flow into or out of said closed chamber.

13. A holder according to claim 12, wherein said fluid is cooling water which cools said reflecting optical member.

14. A holder according to claim 11, wherein said reflecting optical member is supported by three-point seats provided on a side wall portion constituting said closed chamber.

15. A holder according to claim 11, wherein said reflecting optical member is clamped by three-point seats provided on a side wall portion of said closed chamber, in combination with pressing plates which press a peripheral edge portion of said reflecting optical member at respective positions of said three-point seats.

16. A holder according to claim 11, wherein a back surface of said reflecting optical member that is reverse to said reflecting surface has a same surface configuration as that of said reflecting surface so that a thickness of said reflecting optical member between said reflecting surface and said back surface is uniform.

17. A holder according to claim 11, wherein a distribution of thickness in a gravitational direction of said reflecting optical member is varied from a central portion of said reflecting optical member to a peripheral portion thereof so that said reflecting optical member is not deflected in the gravitational direction.

18. A holder according to claim 12, wherein said reflecting optical member is supported by three-point seats provided on a side wall portion constituting said closed chamber.

19. A holder according to claim 12, wherein said reflecting optical member is clamped by three-point seats provided on a side wall portion of said closed chamber, in combination with pressing plates which press a peripheral edge portion of said reflecting optical member at respective positions of said three-point seats.

20. A holder according to claim 12, wherein a back surface of said reflecting optical member that is reverse to said reflecting surface has a same surface configuration as that of said reflecting surface so that a thickness of said reflecting optical member between said reflecting surface and said back surface is uniform.

21. A holder according to claim 12, wherein a distribution of thickness in a gravitational direction of said reflecting optical member is varied from a central portion of said reflecting optical member to a peripheral portion thereof so that said reflecting optical member is not deflected in the gravitational direction.

22. A holder according to claim 10, wherein said reflecting optical member is supported by three-point seats provided on a side wall portion constituting said closed chamber.

23. A holder according to claim 22, wherein said reflecting optical member is clamped by said three-point seats in combination with pressing plates which press a peripheral edge portion of said reflecting optical member at respective positions of said three-point seats.

24. A holder according to claim 22, wherein a back surface of said reflecting optical member that is reverse to said reflecting surface has a same surface configuration as that of said reflecting surface so that a thickness of said reflecting optical member between said reflecting surface and said back surface is uniform.

25. A holder according to claim 22, wherein a distribution of thickness in a gravitational direction of said reflecting optical member is varied from a central portion of said reflecting optical member to a peripheral portion thereof so that said reflecting optical member is not deflected in the gravitational direction.

26. A holder according to claim 10, wherein said reflecting optical member is clamped by three-point seats provided on a side wall portion of said closed chamber, in combination with pressing plates which press a peripheral edge portion of said reflecting optical member at respective positions of said three-point seats.

27. A holder according to claim 26, wherein a back surface of said reflecting optical member that is reverse to said reflecting surface has a same surface configuration as that of said reflecting surface so that a thickness of said reflecting optical member between said reflecting surface and said back surface is uniform.

28. A holder according to claim 26, wherein a distribution of thickness in a gravitational direction of said reflecting optical member is varied from a central portion of said reflecting optical member to a peripheral portion thereof so that said reflecting optical member is not deflected in the gravitational direction.

29. A holder according to claim 10, wherein a back surface of said reflecting optical member that is reverse to said reflecting surface has a same surface configuration as that of said reflecting surface so that a thickness of said reflecting optical member between said reflecting surface and said back surface is uniform.

30. A holder according to claim 10, wherein a distribution of thickness in a gravitational direction of said reflecting optical member is varied from a central portion of said reflecting optical member to a peripheral portion thereof so that said reflecting optical member is not deflected in the gravitational direction.

31. A holder according to claim 11, further comprising:
an inside-gas pressure measuring device which measures an inside-gas pressure in said closed chamber;
an outside-gas pressure measuring device which measures an outside-gas pressure outside said closed chamber; and
a controller which controls said pressure regulating device such that the inside-gas pressure in said closed chamber is regulated on the basis of a difference between the inside-gas pressure measured by said inside-gas pressure measuring device and the outside-gas pressure measured by said outside-gas pressure measuring device.

32. An exposure apparatus which transfers an image of a pattern formed on a mask onto a photosensitive substrate, said apparatus comprising:
a projection optical system including a reflecting optical member and arranged to project the image of said pattern onto said photosensitive substrate; and
a holder which holds said reflecting optical member, said holder having:
a support mechanism which supports a back surface of said reflecting optical member, which is reverse to a reflecting surface of said reflecting optical member, at at least three support points,
wherein said support points of said support mechanism are positioned on a circumference away from a center of said reflecting surface by a distance at least 0.6 times a distance from the center of said reflecting surface to an outer periphery of said reflecting optical member such that said support points are circumferentially spaced along said circumference at equal intervals.

33. An apparatus according to claim 32, wherein said support mechanism has a support plate and support members which support said reflecting optical member with respect to said support plate, each of said support members being non-fixed at at least one of ends thereof which face said support plate and said reflecting optical member, respectively.

34. An exposure apparatus which transfers an image of a pattern formed on a mask onto a photosensitive substrate, said apparatus comprising:

a projection optical system including a reflecting optical member and arranged to project the image of said pattern onto said photosensitive substrate; and a holder having a support plate which supports said reflecting optical member, said holder having:
   support members which support a back surface of said reflecting optical member at at least three support points;
   pressing mechanisms which press the back surface of said reflecting optical member at respective pressing points different from said support points; and
   an adjusting mechanism provided for each of said pressing mechanisms to adjust pressing force with which the associated pressing mechanism presses the back surface of said reflecting optical member.

35. An apparatus according to claim 34, wherein said support points and said pressing points lie on a same circumference a predetermined distance away from a center of said reflecting optical member, and said support points are circumferentially spaced along said circumference at equal intervals.

36. An apparatus according to claim 34, wherein said pressing mechanism includes a fulcrum provided on said support plate, a transmission arm pivotably mounted on said fulcrum, and a pressing member provided on one end of said transmission arm to press the back surface of said reflecting optical member at said pressing point, said pressing member including a rod member standing on said one end of said transmission arm, and said adjusting member including a weight member mounted on the other end of said transmission arm.

37. An apparatus according to claim 34, wherein said pressing mechanism includes a fulcrum provided on said support plate, a transmission arm pivotably mounted on said fulcrum, and a pressing member provided on one end of said transmission arm to press the back surface of said reflecting optical member at said pressing point, said pressing member including a pair of magnets magnetized with magnetic poles of a same sign, said magnets being respectively disposed on said transmission arm and the back surface of said reflecting optical member at said pressing point so as to face opposite to each other, and said adjusting member including a weight member mounted on the other end of said transmission arm.

38. An exposure apparatus which transfers an image of a pattern formed on a mask onto a photosensitive substrate, said apparatus comprising:

a projection optical system including a reflecting optical member and arranged to project the image of said pattern onto said photosensitive substrate; and a holder which supports said reflecting optical member, said holder having:
   a holding member which supports said reflecting optical member and forms a closed chamber in combination with said reflecting optical member,
   wherein a pressure in said closed chamber at a back of a reflecting surface of said reflecting optical member is regulated to a predetermined level.

39. An apparatus according to claim 38, further comprising:

a pressure regulating device which regulates the pressure in said closed chamber to a predetermined level.

40. An apparatus according to claim 39, further comprising:

an inside-gas pressure measuring device which measures an inside-gas pressure in said closed chamber;

an outside-gas pressure measuring device which measures an outside-gas pressure outside said closed chamber; and a controller which controls said pressure regulating device such that the inside-gas pressure in said closed chamber is regulated on the basis of a difference between the inside-gas pressure measured by said inside-gas pressure measuring device and the outside-gas pressure measured by said outside-gas pressure measuring device.

41. An exposure apparatus which transfers an image of a pattern formed on a mask onto a photosensitive substrate through a projection optical system, wherein said projection optical system comprises a catadioptric system including one or a plurality of reflecting mirrors as reflecting optical members, said apparatus comprising a holding member which supports at least one of said reflecting mirrors and forms a closed chamber in combination with said reflecting mirror, wherein a pressure in said closed chamber at a back of a reflecting surface of said reflecting mirror is regulated by a pressure control system on the basis of a weight of said reflecting mirror and a difference between a pressure in said closed chamber and a pressure outside said closed chamber.

42. An apparatus according to claim 41, wherein said catadioptric system is an optical system which includes one or a plurality of reflecting mirrors as reflecting optical members and in which a plurality of reflections take place, and wherein a first reflecting optical member constituting said catadioptric system is said reflecting mirror having said closed chamber subjected to pressure control by said pressure control system.

43. An exposure apparatus which transfers an image of a pattern formed on a mask onto a photosensitive substrate, said apparatus comprising:

a projection optical system including a reflecting optical member and arranged to project the image of said pattern onto said photosensitive substrate, wherein said reflecting optical member is integrally formed with a mounting portion which is secured to said projection optical system.

44. An apparatus according to claim 43, wherein said reflecting optical member has a prism configuration.

45. A projection exposure apparatus comprising:

a projection optical system having a concave mirror, and a first and second reflecting optical elements disposed between said concave mirror and a substrate, said projection optical system being arranged to project an image of a pattern formed on a mask onto said substrate, and said projection optical system having an optical axis which extends perpendicularly to said mask and approximately parallel to a gravitational direction between said mask and said concave mirror, and which extends approximately perpendicularly to said gravitational direction between said first and second reflecting optical elements, and further which extends perpendicularly to said substrate and approximately parallel to said gravitational direction between said second reflecting optical element and said substrate; and a mechanism that supports said concave mirror such that a reflecting surface of said concave mirror faces upward with respect to said gravitational direction, wherein said support mechanism includes a support plate to which said concave mirror is fixed, and a support device that supports said concave mirror on said support plate, said support device having a first support portion that is fixedly provided on said support plate and a second support portion fixedly provided on said concave mirror, said first and second support portions being non-fixedly connected so as to move relative to each other in response to a weight of said concave mirror.

46. A projection exposure apparatus comprising:

a projection optical system having a concave mirror, and a first and second reflecting optical elements disposed between said concave mirror and a substrate, said projection optical system being arranged to project an image of a pattern formed on a mask onto said substrate, and said projection optical system having an optical axis which extends perpendicularly to said mask and approximately parallel to a gravitational direction between said mask and said concave mirror, and which extends approximately perpendicularly to said gravitational direction between said first and second reflecting optical elements, and further which extends perpendicularly to said substrate and approximately parallel to said gravitational direction between said second reflecting optical element and said substrate; and a mechanism that supports said concave mirror such that a reflecting surface of said concave mirror faces upward with respect to said gravitational direction, wherein said support mechanism supports said concave mirror at at least three support points, each of said support points being at a distance from a center of said reflecting surface, said distance being approximately 0.6 times a distance from the center of said reflecting surface to an outer periphery thereof.

47. A projection exposure apparatus comprising:

a projection optical system having a concave mirror, and a first and second reflecting optical elements disposed between said concave mirror and a substrate, said projection optical system being arranged to project an image of a pattern formed on a mask onto said substrate, and said projection optical system having an optical axis which extends perpendicularly to said mask and approximately parallel to a gravitational direction between said mask and said concave mirror, and which extends approximately perpendicularly to said gravitational direction between said first and second reflecting optical elements, and further which extends perpendicularly to said substrate and approximately parallel to said gravitational direction between said second reflecting optical element and said substrate; and a mechanism that supports said concave mirror such that a reflecting surface of said concave mirror faces upward with respect to said gravitational direction, wherein said support mechanism includes a device which supports said concave mirror at at least three support points and which presses said concave mirror at points different from said support points.

48. A projection exposure apparatus comprising:

a projection optical system having a concave mirror, and a first and second reflecting optical elements disposed between said concave mirror and a substrate, said projection optical system being arranged to project an image of a pattern formed on a mask onto said substrate, and said projection optical system having an optical axis which extends perpendicularly to said mask and approximately parallel to a gravitational direction between said mask and said concave mirror, and which extends approximately perpendicularly to said gravitational direction between said first and second reflecting optical elements, and further which extends perpendicularly to said substrate and approximately parallel to said gravitational direction between said second reflecting optical element and said substrate; and a mechanism that supports said concave mirror such that a reflecting surface of said concave mirror faces upward with respect to said gravitational direction, wherein said support mechanism includes a holder which holds said concave mirror and forms a closed chamber in combination with said concave mirror, and a device which regulates a pressure in said closed chamber.

49. A projection exposure apparatus comprising:

a projection optical system having a concave mirror, and a first and second reflecting optical elements disposed between said concave mirror and a substrate, said projection optical system being arranged to project an image of a pattern formed on a mask onto said substrate, and said projection optical system having an optical axis which extends perpendicularly to said mask and approximately parallel to a gravitational direction between said mask and said concave mirror, and which extends approximately perpendicularly to said gravitational direction between said first and second reflecting optical elements, and further which extends perpendicularly to said substrate and approximately parallel to said gravitational direction between said second reflecting optical element and said substrate; and a mechanism that supports said concave mirror such that a reflecting surface of said concave mirror faces upward with respect to said gravitational direction, said projection exposure apparatus further comprising:
a holder which holds at least one of said first and second reflecting optical elements and forms a closed chamber in combination with said reflecting optical element that is held by said holder; and
a device which regulates a pressure in said closed chamber.

50. A projection exposure apparatus comprising:

a projection optical system having a concave mirror, and a first and second reflecting optical elements disposed between said concave mirror and a substrate, said projection optical system being arranged to project an image of a pattern formed on a mask onto said substrate, and said projection optical system having an optical axis which extends perpendicularly to said mask and approximately parallel to a gravitational direction between said mask and said concave mirror, and which extends approximately perpendicularly to said gravitational direction between said first and second reflecting optical elements, and further which extends perpendicularly to said substrate and approximately parallel to said gravitational direction between said second reflecting optical element and said substrate; and a mechanism that supports said concave mirror such that a reflecting surface of said concave mirror faces upward with respect to said gravitational direction, wherein at least one of said first and second reflecting optical elements is integrally formed with a mounting portion which is secured to said projection optical system.

\* \* \* \* \*